US009330884B1

(12) United States Patent
Frosien

(10) Patent No.: US 9,330,884 B1
(45) Date of Patent: May 3, 2016

(54) DOME DETECTION FOR CHARGED PARTICLE BEAM DEVICE

(71) Applicant: ICT Integrated Circuit Testing Gesellschaft für Halbleiterprüftechnik mbH, Heimstetten (DE)

(72) Inventor: Jürgen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 14/538,338

(22) Filed: Nov. 11, 2014

(51) Int. Cl.
*H01J 37/147* (2006.01)
*H01J 37/244* (2006.01)
*H01J 37/05* (2006.01)

(52) U.S. Cl.
CPC .............. *H01J 37/244* (2013.01); *H01J 37/05* (2013.01); *H01J 2237/2448* (2013.01); *H01J 2237/24507* (2013.01)

(58) Field of Classification Search
USPC ........... 250/492.1, 492.2, 492.3, 492.21, 309, 250/310, 396 R, 357, 583, 526
See application file for complete search history.

(56) References Cited

U.S. PATENT DOCUMENTS

| | | | | |
|---|---|---|---|---|
| 6,064,071 A * | 5/2000 | Nakasuji | ................ | B82Y 10/00 250/396 ML |
| 6,441,384 B1 * | 8/2002 | Kojima | .................. | B82Y 10/00 250/492.22 |
| 6,627,900 B2 * | 9/2003 | Fukui | .................. | H01J 37/3023 250/396 R |

(Continued)

*Primary Examiner* — Bernard E Souw

(74) *Attorney, Agent, or Firm* — Kilpatrick Townsend & Stockton LLP

(57) ABSTRACT

According to an embodiment, a method of operating a charged particle beam device is provided. The charged particle beam device includes a beam separation unit, a first optical component distanced from the beam separation unit and a second optical component distanced from the beam separation unit and distanced from the first optical component. The method includes generating a primary charged particle beam. The method further includes generating a first electric field and a first magnetic field in the beam separation unit. The method further includes guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field. The method further includes generating a secondary charged particle beam by impingement of the primary charged particle beam onto a sample. The method further includes separating the secondary charged particle beam from the primary charged particle beam in the beam separation unit, wherein the secondary charged particle beam is deflected under the influence of the first electric field and the first magnetic field to travel from the beam separation unit to the first optical component. The method further includes generating a second electric field and a second magnetic field in the beam separation unit. The method further includes guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field. The method further includes separating the secondary charged particle beam from the primary charged particle beam in the beam separation unit, wherein the secondary charged particle beam is deflected under the influence of the second electric field and the second magnetic field to travel from the beam separation unit to the second optical component.

20 Claims, 10 Drawing Sheets

(56) References Cited

U.S. PATENT DOCUMENTS

| | | | |
|---|---|---|---|
| 6,943,351 B2 * | 9/2005 | Parker | H01J 37/065 250/306 |
| 7,034,297 B2 * | 4/2006 | Petrov | G01N 23/225 250/306 |
| 7,095,023 B2 * | 8/2006 | Nagano | H01J 37/244 250/310 |
| 7,544,937 B2 * | 6/2009 | Frosien | H01J 37/05 250/310 |
| 7,875,849 B2 * | 1/2011 | Fukuda | H01J 37/244 250/310 |
| 2006/0226360 A1 * | 10/2006 | Frosien | H01J 37/05 250/310 |
| 2014/0299767 A1 * | 10/2014 | Bizen | H01J 37/28 250/307 |

\* cited by examiner

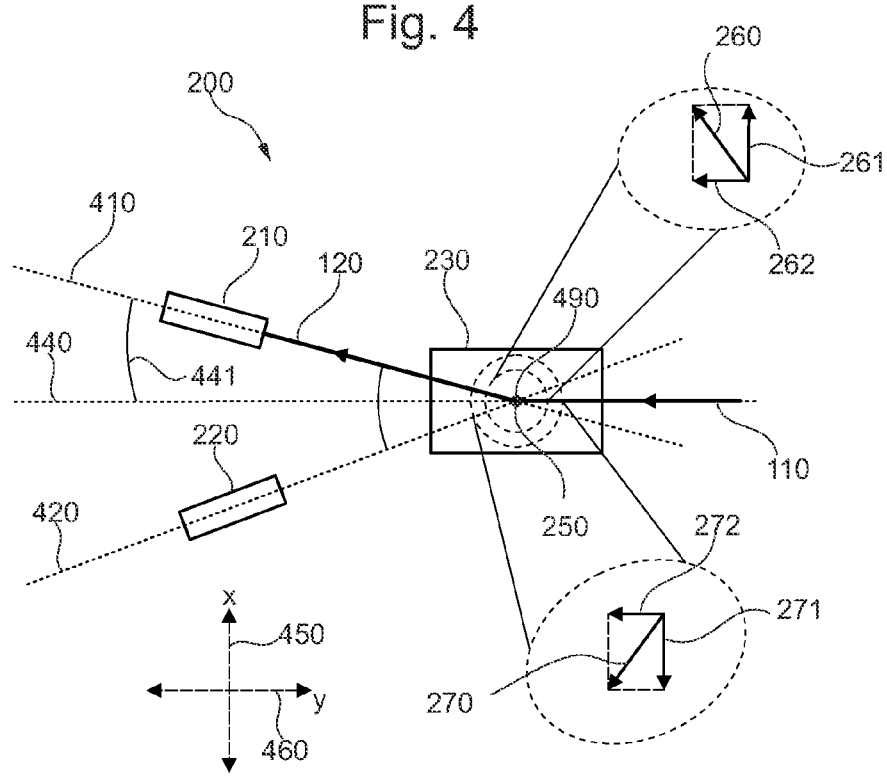
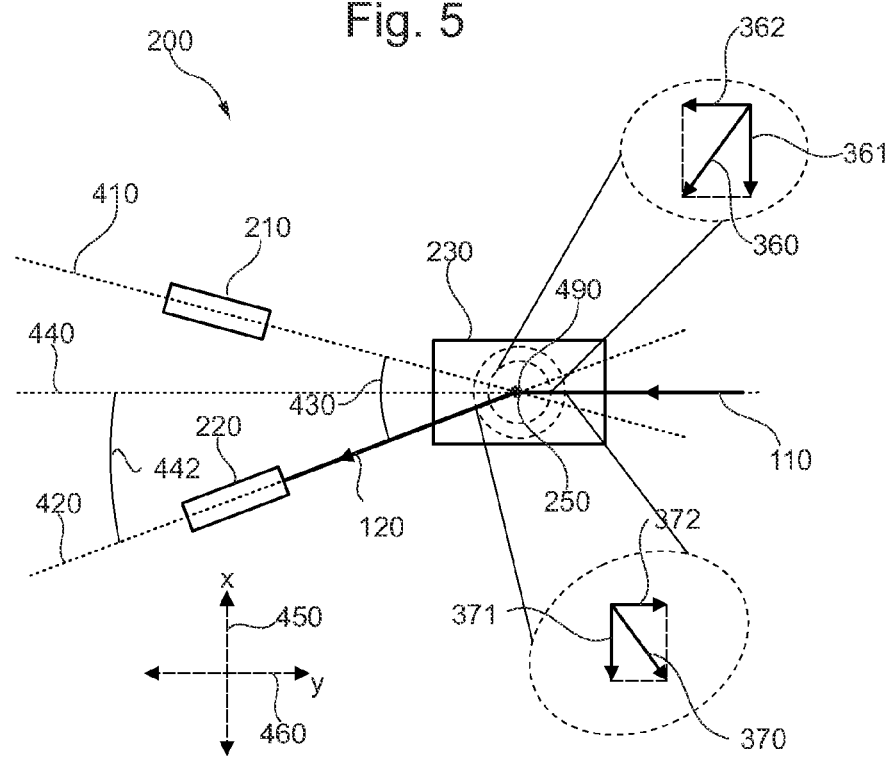

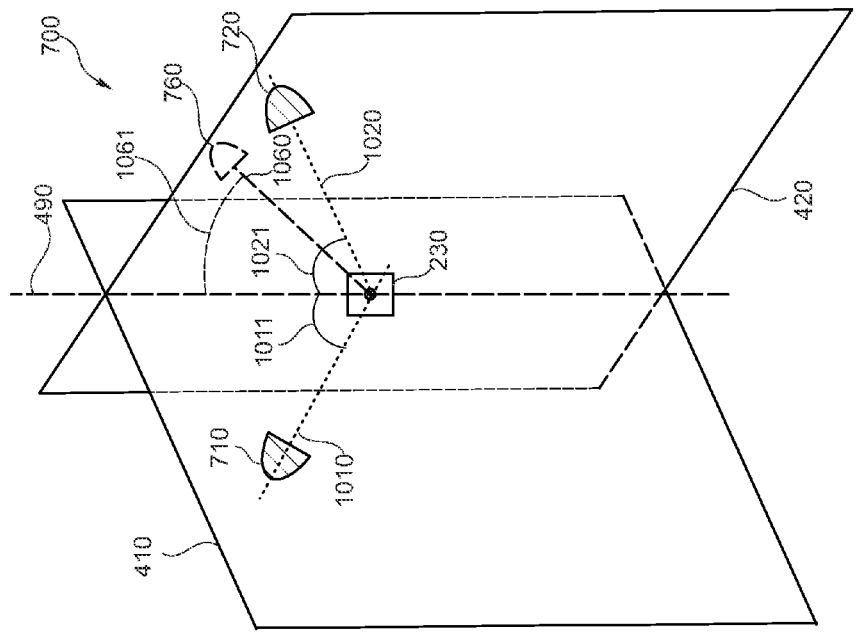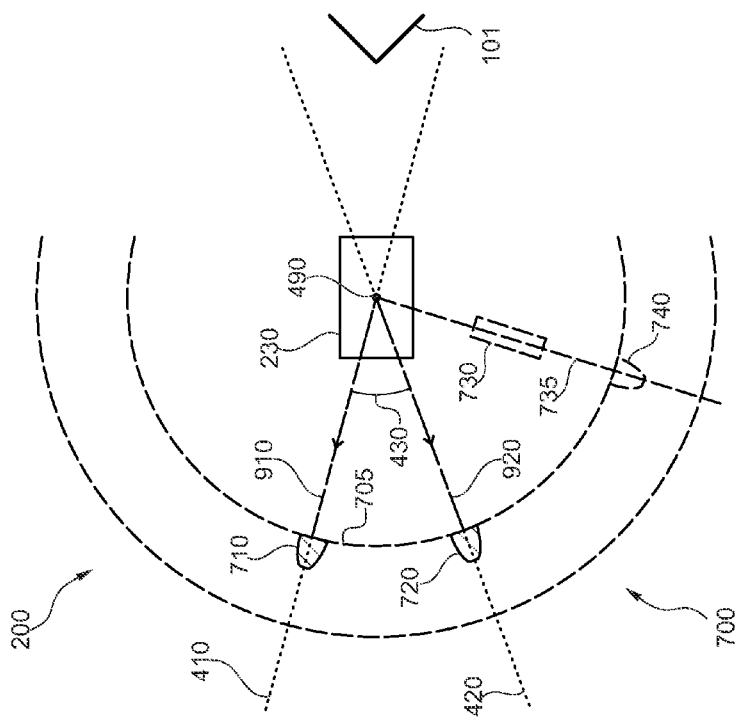

DOME DETECTION FOR CHARGED PARTICLE BEAM DEVICE

FIELD

The present disclosure relates to a charged particle device, e.g. for imaging and/or manipulating a sample, and a method of operating the charged particle beam device. Specifically, embodiments described herein relate to a charged particle beam device which includes a beam separation unit for separating primary charged particles from secondary charged particles generated by impingement of the primary charged particle beam onto the sample.

BACKGROUND

Charged particle beam systems are widely spread in the semiconductor industry. Examples of charged particle beam devices are electron microscopes such as secondary electron microscopes (SEM), electron beam pattern generators, ion microscopes as well as ion beam pattern generators. Charged particle beams, in particular electron beams, offer superior spatial resolution compared to photon beams, due to their short wavelengths at comparable particle energy.

Charged particle beam systems are used for quality evaluations and control of semiconductor processes, e.g. for inspection of critical dimensions (CD), defect review (DR), or wafer and mask defect inspection. For these tools special low voltage electron optical columns have been developed, in particular SEM-based devices, which either deliver high resolution having electron probes with nanometer and sub-nanometer diameters for CD & DR, or generate high current density electron probes for wafer & mask inspection or hot spot inspection. Because of the high demands regarding probe size and/or probe current density the focus in the electron optics development was on the optimization of the primary electron beam (PE) optics. Efforts have been made to reduce/optimize the lens aberrations (mainly spherical and chromatic aberration) as well as electron-electron interaction. Recently also some focus was directed on the SE detection, since optimized detection will improve not only the contrast which eases image analysis but also reduces image acquisition time. The latter improves throughput which is relevant in particular in electron beam inspection (EBI) and HS applications.

In this context, separation of the PE beam and the signal electron (SE) beam, including secondary electrons and backscattered electrons, has been introduced which enables an off-axis detection. The related SE beam path may be generated by a beam separator for separating the SE beam from the PE beam. SE optics may be used to shape the SE beam for detection on a detector, e.g., a segmented detector.

Even though the SE beam is separated from the PE beam by the beam separator, the space available for detector arrangements in the charge particle beam device may be limited. For extracting more information about the semiconductor processes for quality evaluation and control of such processes, the detector arrangements become more complex and may tend to be larger, making the problem of space limitations more pronounced.

Consequently, there is a need for an improved charged particle beam device and method of operating the same.

SUMMARY

According to an embodiment, a method of operating a charged particle beam device is provided. The charged particle beam device includes a beam separation unit, a first optical component distanced from the beam separation unit and a second optical component distanced from the beam separation unit and distanced from the first optical component. The method includes generating a primary charged particle beam. The method further includes generating a first electric field and a first magnetic field in the beam separation unit. The method further includes guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field. The method further includes generating a secondary charged particle beam by impingement of the primary charged particle beam onto a sample. The method further includes separating the secondary charged particle beam from the primary charged particle beam in the beam separation unit, wherein the secondary charged particle beam is deflected under the influence of the first electric field and the first magnetic field to travel from the beam separation unit to the first optical component. The method further includes generating a second electric field and a second magnetic field in the beam separation unit. The method further includes guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field. The method further includes separating the secondary charged particle beam from the primary charged particle beam in the beam separation unit, wherein the secondary charged particle beam is deflected under the influence of the second electric field and the second magnetic field to travel from the beam separation unit to the second optical component.

According to another embodiment, a method of operating a charged particle beam device is provided. The charged particle beam device includes a beam separation unit. The method includes generating a primary charged particle beam. The method further includes generating a first magnetic field and a first electric field in the beam separation unit. The method further includes guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field. The method further includes generating a secondary charged particle beam by impingement of the primary charged particle beam onto a sample. The method further includes deflecting the secondary charged particle beam in the beam separation unit to separate the secondary charged particle beam from the primary charged particle beam, wherein a travel direction of the secondary charged particle beam leaving the beam separation unit is aligned with a second target axis under the influence of the first electric field and the first magnetic field. The method further includes generating a second magnetic field and a second electric field in the beam separation unit. The method further includes guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field. The method further includes deflecting the secondary charged particle beam in the beam separation unit to separate the secondary charged particle beam from the primary charged particle beam, wherein the travel direction of the secondary charged particle beam leaving the beam separation unit is aligned with a third target axis under the influence of the second electric field and the second magnetic field, wherein the third target axis is different from the second target axis.

According to another embodiment, a charged particle beam device is provided. The charged particle beam device includes a beam emitter for emitting a primary charged particle beam. The charged particle beam device further includes a beam separation unit for separating the primary charged particle beam from a secondary charged particle beam generated upon impingement of the primary charged particle beam onto a sample, the beam separation unit defining an optical axis. The charged particle beam device further includes a detector dome comprising secondary charged particle detectors, the secondary charged particle detectors comprising a first detector and a second detector. Therein, the first detector is arranged downstream, with respect to a first optical path of the secondary charged particle beam, of the beam separation unit; and the second detector is arranged downstream, with respect to a second optical path of the secondary charged particle beam, of the beam separation unit. Therein, an azimuthal angle exists between a first plane and a second plane, the first plane containing the optical axis and extending through the first detector and the second plane containing the optical axis and extending through the second detector.

According to another embodiment, a charged particle beam device is provided. The charged particle beam device includes a beam emitter for emitting a primary charged particle beam. The charged particle beam device further includes a beam separation unit for separating the primary charged particle beam from a secondary charged particle beam generated by impingement of the primary charged particle beam onto a sample, the beam separation unit being adapted for generating a first magnetic field, a second magnetic field, a first electric field and a second electric field. The charged particle beam device further includes a first optical component distanced from the beam separation unit. The charged particle beam device further includes a second optical component distanced from the beam separation unit and from the first optical component. Therein, the beam separation unit is configured for aligning a travel direction of the primary charged particle beam leaving the beam separation unit with a first target axis under the influence of the first electric field and the first magnetic field and for deflecting the secondary charged particle beam in the beam separation unit under the influence of the first electric field and the first magnetic field to travel from the beam separation unit to the first optical component. The beam separation unit is further configured for aligning the travel direction of the primary charged particle beam leaving the beam separation unit with the first target axis under the influence of the second electric field and the second magnetic field, and for deflecting the secondary charged particle beam in the beam separation unit under the influence of the second electric field and the second magnetic field to travel from the beam separation unit to the second optical component.

Embodiments are also directed to methods for operating the disclosed system. The method features may be performed manually or automated, e.g. controlled by a computer programmed by appropriate software, by any combination of the two or in any other manner.

Further advantages, features, aspects and details that can be combined with embodiments described herein are evident from the dependent claims, the description and the drawings.

BRIEF DESCRIPTION OF THE DRAWINGS

A full and enabling disclosure to one of ordinary skill in the art is set forth more particularly in the remainder of the specification including reference to the accompanying drawings wherein:

FIGS. 4-5 provide a top view of a charged particle beam device according to embodiments described herein, including a first optical component and a second optical component.

FIGS. 7-9 provide a top view of a charged particle beam device including a detector dome according to embodiments described herein.

FIG. 10 provides a front view of a charged particle beam device according to embodiments described herein, including a first detector and a second detector.

DETAILED DESCRIPTION

Figure 1:
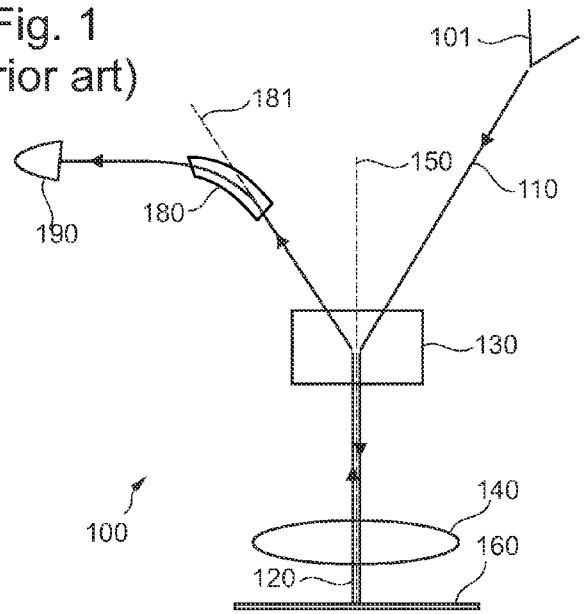
FIG. 1 shows a set-up for a charged particle beam system.

Reference will now be made in detail to the various exemplary embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. The intention is that the present disclosure includes such modifications and variations.

Within the following description of the drawings, the same reference numbers refer to the same components. Only the differences with respect to the individual embodiments are described. The structures shown in the drawings are not necessarily depicted true to scale but rather serve the better understanding of the embodiments.

The term "sample", as used herein, may include, but is not limited to, semiconductor wafers, semiconductor workpieces, and other workpieces such as memory disks and the like. Embodiments may be applied to any workpiece on which material is deposited, which is inspected or which is structured. A sample may include a surface to be structured, imaged or on which layers are deposited. The term "charged particles", as used herein, may include electrons, ions, atoms, or other charged particles. The term "primary charged particles" refers to charged particles being emitted by a beam emitter and being directed onto a sample. The term "secondary charged particles" refers to charged particles created at or in the sample, and/or backscattered charged particles. For instance, the term "secondary electrons" can include secondary electrons (SE), back scattered electrons (BSE) and Auger electrons. If the secondary charged particles are electrons, the secondary charged particles may e.g. include Auger electrons and backscattered electrons. Secondary electrons are also referred to as signal electrons, and secondary charged particles are also referred to as signal charged particles.

A set-up of a known charged particle beam system 100 is shown in FIG. 1. The charged particle beam system 100 includes a beam emitter 101 for emitting charged particles. The beam emitter may e.g. be an electron gun. The primary charged particle beam 110 emitted from the beam emitter 101 travels from the beam emitter 101 to a beam separator 130. The primary charged particle beam 110 is deflected in the beam separator 130 and subsequently travels from the beam separator 130 to an objective lens 140 adapted for focusing the primary charged particle beam 110 onto a sample 160. In the exemplary system shown in FIG. 1, the primary charged particle beam 110, when traveling from the beam separator 130 to the sample 160 via the objective lens 140, travels along an optical axis 150 of the beam separator 130 and of the objective lens 140.

Upon impingement of the primary charged particle beam 110 on the sample 160, a secondary charged particle beam 120 is generated. The secondary charged particle beam 120 travels from the sample 160 to the beam separator 130, wherein the secondary charged particle beam 120 travels in the opposite direction of the primary charged particle beam 110. The beam separator 130 acts on the primary and secondary charged particle beams and is adapted for separating the primary charged particle beam from the secondary charged particle beam. As shown, the secondary charged particle beam 120 is deflected in the beam separator 130, wherein the deflection is such that the secondary charged particle beam leaving the beam separator is directed away from the primary charged particle beam 110. The secondary charged particle beam 120 may travel from the beam separator 130 to an optical element 180 along an axis 181. In the exemplary system shown in FIG. 1, the optical element 180 is a beam bender adapted to guide the secondary charged particle beam 120 further away from the primary charged particle beam 110. After passing through optical element 180, the secondary charged particle beam 120 may be influenced by secondary charged particle optics (not shown) and is guided to a detector 190.

The detector 190 is used to detect information carried in the secondary charged particle beam. For extracting an increasing amount of information about the sample 160, e.g., for quality evaluation and control of semiconductor processes, the detector 190 may become complex and large, creating a problem due to the limited space in a charged particle beam column of a charged particle beam device.

Embodiments described herein relate to a charged particle beam device and a method of operating the charged particle beam device. Before providing a detailed discussion of embodiments below, some aspects are discussed beforehand with reference to an embodiment shown in FIG. 15.

Figure 15:
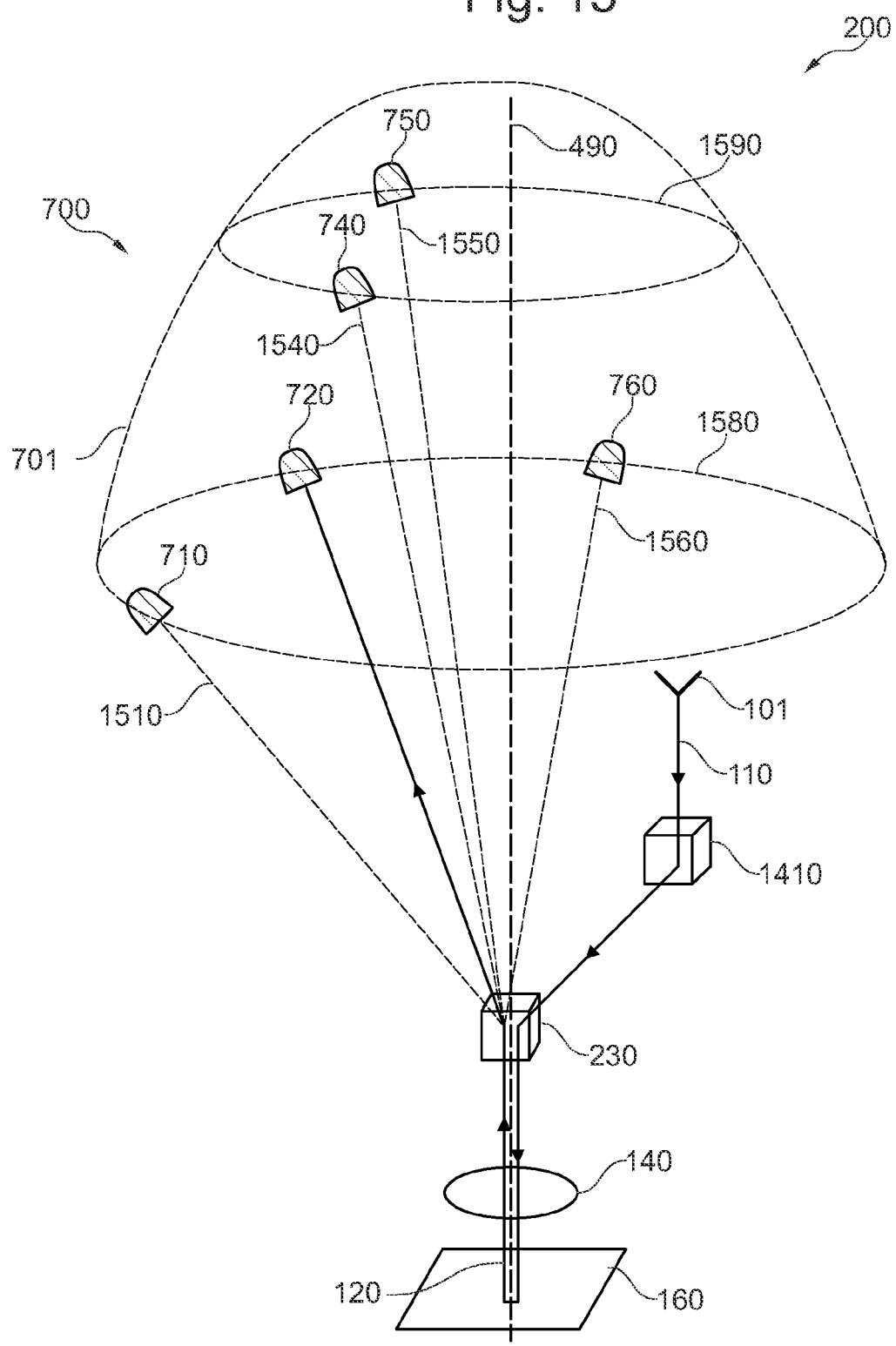
FIG. 15 shows a charged particle beam device according to embodiments described herein.

FIG. 15 shows an exemplary charged particle beam device 200. The charged particle beam device 200 includes a beam separation unit 230 defining an optical axis 490, wherein the beam separation unit is of two-dimensional Wien filter type. The charged particle beam device 200 further includes a dispersion compensation unit 1410, wherein the dispersion compensation unit 1410 is also of two-dimensional Wien filter type. The charged particle beam device 200 further includes a detector dome 700 including secondary charged particle detectors 710, 720, 740, 750, 760 adapted for detecting the secondary charged particle beam 120 leaving the beam separation unit 230 in different directions. In the exemplary embodiment shown, five secondary charged particle detectors are included in the detector dome 700. However, the detector dome 700 may also contain fewer or more secondary charged particle detectors, as described in detail below.

The secondary charged particle detectors 710, 720, 740, 750, 760 shown in FIG. 15 are arranged above the sample 160, above the objective lens 140, and above the beam separation unit 230. The spatial arrangement of the detectors 710, 720, 740, 750, 760 is a three-dimensional arrangement, wherein the detectors 710, 720, 740, 750, 760 are arranged at different positions on a curved surface 701 having rotational symmetry about the optical axis 490, e.g., a half-sphere, above the beam separation unit 230, as indicated by the dashed lines. Specifically, the detectors 710, 720 and 760 may be arranged on a first circle 1580 and the detectors 740 and 750 may be arranged on a second circle 1590 parallel to the first circle 1580. The circles 1580 and 1590 represent lines of different latitudes on the curved surface 701 with respect to the optical axis 490. As shown, the second circle 1590 lies at a greater height above the beam separation unit 230 compared to the first circle 1580, so that the detectors 740 and 750 are arranged at a greater height compared to the detectors 710, 720 and 760.

The beam separation unit 230 shown in FIG. 15 is adapted for generating an electric field and an a magnetic field to act on the primary charged particle beam 110 and on the secondary charged particle beam 120 passing through the beam separation unit 230. Since the beam separation unit 230 is of two-dimensional Wien filter type, the electric field and the magnetic field can be generated in any desired direction in a plane perpendicular to the optical axis 490, as will be discussed in detail below, e.g. with respect to FIGS. 11-13. The primary charged particle beam 110 and the secondary charged particle beam 120 can thus be deflected in any desired direction under the influence of the electric field and the magnetic field generated in the beam separation unit 230. In particular, by suitably adjusting the electric field and the magnetic field generated in the beam separation unit 230, the secondary charged particle beam 120 leaving the beam separation unit 230 may be deflected to travel to any one of the secondary charged particle detectors included in the detector dome 700. In FIG. 15, the configuration of the electric field and the magnetic field is such that the secondary charged particle beam 120 is deflected to travel from the beam separation unit 230 to detector 720. By suitably adjusting the field configuration, the secondary charged particle beam 120 can also be deflected to travel from the beam separation unit 230 to any one of the detectors 710, 740, 750 and 760 included in the detector dome 700, as indicated by the dashed lines 1510, 1540, 1550 and 1560, respectively.

Since the electric field and the magnetic field generated in the beam separation unit 230 of two-dimensional Wien filter type have a sufficiently large number of degrees of freedom, the direction along which the secondary charged particle beam 120 is made to travel can be chosen independently of the direction along which the primary charged particle beam 110 is made to travel. In particular, by suitably adjusting the electric field and the magnetic field generated in the beam separation unit 230, the secondary charged particle beam 120 leaving the beam separation unit 230 may be deflected to travel to any one of the secondary charged particle detectors included in the detector dome 700 and, at the same time, the path of the primary charged particle beam 110 leaving the beam separation unit 230 can be kept fix.

The charged particle device and method of operating the same according to the embodiments described herein lift or at least reduce space constraints regarding the secondary charged particle detection assemblies. The secondary charged particle detectors, and other optical components such as secondary charged particle beam optics, can be arranged in the full 3-dimensional half-space above the beam separation unit, specifically at different heights or latitudes (or polar angles as will be described further below) and/or at different longitudes (or azimuthal angles as will be described further below). For instance, compared to systems in which the primary charged particle beam and the secondary charged particle beam are restricted to travel within a single plane, such as e.g. charged particle beam system 100 shown in FIG. 1, embodiments described herein thus provide additional space for arranging multiple secondary charged particle detectors in the charged particle beam device. The detector dome 700 uses the whole 3-dimensional space above the sample plane, objective lens 140 and beam separation unit 230 for detecting the secondary charged particle beam. Accordingly, an improved detection of the secondary charged particle beam is provided, wherein sufficient space is provided for arranging the multiple detectors in the device. Multiple detectors included in the detector dome may be used for detecting multiple properties of the secondary charged particle beam.

In the embodiment shown in FIG. 15, the configuration of the electric field and the magnetic field is such that the primary charged particle beam 110 is deflected to travel from the beam separation unit 230 to the objective lens 140 travel along the optical axis 490. By suitably adjusting the configuration of the electric field and the magnetic field, the primary charged particle beam can be made to travel away from the beam separation unit along any preselected target axis independently of the direction in which the secondary charged particle beam is deflected. Accordingly, the sample can be inspected from different directions. This may provide more information about the sample surface compared to a case where the sample is inspected from a single direction. For instance, structures such as trenches in the sample surface with vertical walls may be nearly invisible when viewed directly from above, but can be revealed by observation with a tilted primary charged particle beam.

The electric field and the magnetic field generated in the beam separation unit 230 may introduce dispersion in the primary charged particle beam 110. Dispersion may result when primary charged particles have different individual energies or momenta, and so they are not experiencing the same deflection in the beam separation unit 230. To compensate the dispersion introduced in the primary charged particle beam by the beam separation unit 230, the charged particle beam device 200 shown in FIG. 15 includes a dispersion compensation unit 1410 arranged upstream of the beam separation unit 230 in relation to the primary charged particle beam 110. Since the dispersion is introduced by beam separation unit 230 in two dimensions, the dispersion compensation unit 1410 is of two-dimensional Wien filter type as well. In particular, the dispersion compensation unit 1410 is adapted to generate an electrostatic dispersion compensation field and a magnetic dispersion compensation field in any direction in a plane perpendicular to the optical axis 490 to compensate the dispersion introduced by the electric field and the magnetic field generated by the beam separation unit 230.

An advantage of compensating the dispersion is that small charged particle probes with high current density may thus be generated.

In the following, a detailed discussion is provided of embodiments of the charged particle beam device and of the method of operating the charged particle beam device.

According to embodiments, a charged particle beam device is provided. The charged particle beam device described herein includes a beam separation unit. The charged particle beam device may further include a first optical component distanced from the beam separation unit and a second optical component distanced from the beam separation unit and from the first optical component.

Figure 2:
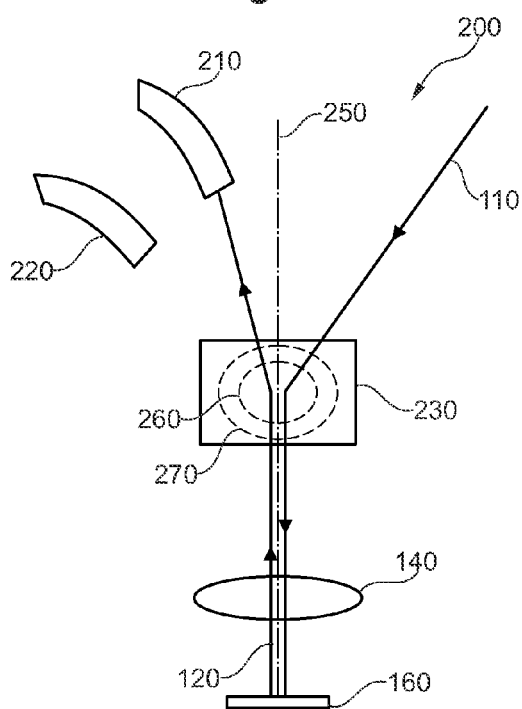
FIGS. 2-3 provide a side view of a charged particle beam device according to embodiments described herein, including a first optical component and a second optical component.
Figure 3:
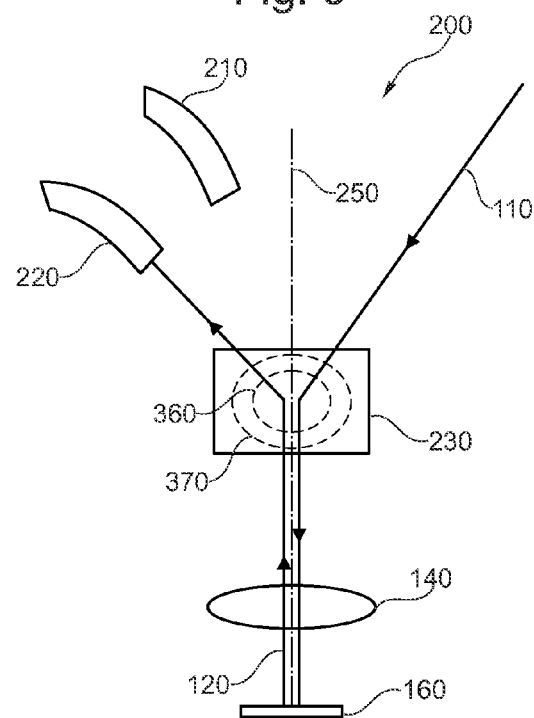

FIGS. 2 and 3 provide a side view of an exemplary charged particle beam device in different states of operation, according to embodiments described herein. The charged particle beam device 200 shown in FIGS. 2-3 includes a beam separation unit 230, a first optical component 210 and second optical component 220. In the exemplary embodiment shown, the first optical component 210 and the second optical component 220 are beam benders.

The method of operating the charged particle beam device includes generating a primary charged particle beam. The primary charged particle beam may be emitted by a beam emitter included in the charged particle beam device.

The method further includes generating a first electric field and a first magnetic field in the beam separation unit. For example, in the embodiment shown in FIG. 2, a first electric field 260 and first magnetic field 270 generated in the beam separation unit 230 are illustrated.

The method further includes guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field. Accordingly, the primary charged particle beam may travel along the first target axis upon leaving the beam separation unit.

For example, in the charged particle beam device 200 shown in FIG. 2, the primary charged particle beam 110 travels along a first target axis 250 upon leaving the beam separation unit 230. In the exemplary embodiment shown, the first target axis 250 is a symmetry axis of the beam separation unit 230 which extends vertically through a central portion of beam separation unit 230. The primary charged particle beam 110 leaving the beam separation unit 230 travels vertically downward along the first target axis 250 under the influence of the first electric field 260 and the first magnetic field 270. The first target axis may also coincide with a symmetry axis of an objective lens 140. In FIG. 2, the first target axis is an optical axis defined by the beam separation unit 230 and the objective lens 140.

According to some embodiments, the first target axis may extend through the beam separation unit, wherein the orientation of the first target axis with respect to the beam separation unit may be a variable and/or selectable orientation, e.g., depending on different modes of inspecting or structuring the sample. The orientation of the first target axis may influence, or determine, a target inclination angle of the primary charged particle beam impinging on the sample.

For example, the primary charged particle beam 110 shown in FIG. 2 travels from the beam separation unit 230 to the objective lens 140 along the first target axis 250. Since the first target axis 250 is oriented vertically, the primary charged particle beam 110 travels vertically downward from the beam separation unit 230 to the objective lens 140. The primary charged particle beam 110 is depicted in the state of impinging onto the sample 160 perpendicularly to the surface of the sample 160, meaning that, in the exemplary embodiment shown, the inclination angle of the primary charged particle beam 110 on the sample 160 is 90 degrees. Of course, the primary charged particle beam may be scanned over the surface of the sample, e.g., by corresponding deflection electrodes (not shown), and may thus not impinge perpendicularly on the sample at all locations.

An advantage of having a variable inclination angle is that the sample may be analyzed in a tilted beam mode. This may provide more information about the sample surface compared to a case where the sample is inspected from a single direction. For instance, structures such as trenches in the sample surface with vertical walls may be nearly invisible when viewed directly from above, but can be revealed by observation with a tilted primary charged particle beam.

The beam separation unit may define an optical axis. The first target axis may coincide with the optical axis. The first target axis may alternatively be inclined with respect to the optical axis. The primary charged particle beam may travel along the optical axis upon entering the beam separation unit and/or upon leaving the beam separation unit. Alternatively, the primary charged particle beam may travel at an angle to the optical axis of the beam separation unit before entering the beam separation unit.

The optical axis may be a symmetry axis of the beam separation unit, e.g. a mirror axis of the beam separation unit. The optical axis may extend through a center of the beam separation unit. The charged particle beam device may include an objective lens. The optical axis may alternatively or conjointly be defined by the objective lens. The beam separation unit and the objective lens may each define an optical axis, and the optical axis of the beam separation unit may be parallel to, or coincide with, the optical axis of the objective lens.

The primary charged particle beam may enter and leave the beam separation unit at different sides of the beam separation unit, more specifically at opposite sides of the beam separation unit. For example, in the charged particle beam device shown illustrated in FIG. 2, the primary charged particle beam 110 enters the beam separation at an upper side of the beam separation unit 230 and leaves the beam separation unit 230 at a lower side of the beam separation unit 230 opposite from the upper side.

According to embodiments, the travel direction of the primary charged particle beam leaving the beam separation unit may be determined by or at least be dependent on the first electric field and/or first magnetic field. The primary charged particle beam may be deflected in the beam separation unit under the influence of the first electric field and/or the first magnetic field. Accordingly, the travel direction of the primary charged particle beam leaving the beam separation unit may be different from a travel direction of the primary charged particle beam entering the beam separation unit.

For example, in the embodiment shown in FIG. 2, the primary charged particle beam 110 entering the beam separation unit 230 is inclined with respect to the first target axis 250. The primary charged particle beam 110 is subsequently deflected in the beam separation unit 230 under the influence of the first electric field 260 and the first magnetic field 270. The deflection is such that the primary charged particle beam 110 travels along the first target axis 250 upon leaving the beam separation unit 230.

According to other embodiments, the first electric field and the first magnetic field may be such that the primary charged particle beam is not deflected in the beam separation unit. Accordingly, the travel direction of the primary charged particle beam entering the beam separation and the travel direction of the primary charged particle beam leaving the beam separation unit may coincide.

The influence of the first electric field on the primary charged particle beam may include an electrostatic deflection of the primary charged particle beam. The first electric field generates an electric force. The electric force may act on the primary charged particle beam traveling through the beam separation unit, and cause an electrostatic deflection of the charged particle beam in the beam separation unit. The electrostatic deflection is, in first approximation, proportional to the strength of the first electric field and inversely proportional to the energy of the primary charged particle beam travelling through the beam separation unit. The electrostatic deflection of the primary charged particle beam may be an electrostatic deflection in one spatial dimension or an electrostatic deflection in two spatial dimensions.

The influence of the first magnetic field on the primary charged particle beam may include a magnetic deflection of the primary charged particle beam. The first magnetic field generates a magnetic force. The magnetic force may act on the primary charged particle beam traveling through the beam separation unit, and cause a magnetic deflection of the primary charged particle beam. The magnetic deflection is, in first approximation, proportional to the strength of the first magnetic field and inversely proportional to the square root of the energy of the primary charged particle beam passing through the beam separation unit. The magnetic deflection of the primary charged particle beam may be a magnetic deflection in one spatial dimension or a magnetic deflection in two spatial dimensions.

A direction in which the first electric field is generated and/or a direction in which the first magnetic field is generated may be perpendicular or substantially perpendicular to the optical axis defined by the beam separation unit. The first electric field may be a homogeneous first electric field, at least in the region where the primary charged particle beam passes through the first electric field. The first magnetic field may be a homogeneous first magnetic field, at least in the region where the primary charged particle beam passes through the first electric field. The first electric field may be perpendicular or substantially perpendicular to the first magnetic field, at least in the region where the primary charged particle beam passes through the first electric field. Here, the term "substantially perpendicular" means a tolerance of less than or equal to ±10°, in particular less than or equal to ±5°.

The method further includes generating a secondary charged particle beam by impingement of the primary charged particle beam onto a sample. The sample may be disposed on the side of the beam separation unit at which the primary charged particle beam leaves the beam separation unit. The secondary charged particle beam may leave the sample at the side of the sample, or from the surface of the sample, at which the primary charged particle beam impinges on the sample. The secondary charged particle beam may travel away from the sample in a direction which is opposite to the direction in which the primary charged particle travels directly before impinging onto the sample.

For example, in the charged particle beam device 200 shown in FIG. 2, the secondary charged particle beam 120 travels vertically upward from the sample 160 to the beam separation unit 230 along the first target axis 250. Accordingly, the travel direction of the secondary charged particle beam 120 traveling away from the sample 160 is opposite to the travel direction of the primary charged particle beam 110 traveling towards the sample 160.

According to some embodiments, the method further includes separating the secondary charged particle beam from the primary charged particle beam in the beam separation unit, wherein the secondary charged particle beam is deflected under the influence of the first electric field and the first magnetic field to travel from the beam separation unit to the first optical component.

The secondary charged particle beam may travel through the beam separation unit. The secondary charged particle beam may enter and leave the beam separation unit at different sides of the beam separation unit, more specifically at opposite sides of the beam separation unit. The sample may be disposed on the side of the beam separation unit at which the secondary charged particle beam enters the beam separation unit. The primary charged particle beam and the secondary charged particle beam may enter the beam separation unit at different sides of the beam separation unit, more specifically, at opposite sides of the beam separation unit.

Separating the secondary charged particle beam from the primary charged particle beam may include directing the secondary charged particle beam leaving the beam separation unit away from a path along which the primary charged particle beam travels before entering the beam separation unit.

A travel direction of the secondary charged particle beam leaving the beam separation unit may be determined by, or be dependent on, the first electric field and/or the first magnetic field. The travel direction of the secondary charged particle beam leaving the beam separation unit may be different from a travel direction of the secondary charged particle beam entering the beam separation unit.

The influence of the first electric field on the secondary charged particle beam may include an electrostatic deflection of the secondary charged particle beam. The electric force generated by the first electric field may act on the secondary charged particle beam traveling through the beam separation unit, and cause an electrostatic deflection of the charged particle beam in the beam separation unit. The electrostatic deflection of the secondary charged particle beam is, in first approximation, proportional to the strength of the first electric field and inversely proportional to the energy of the secondary charged particle beam travelling through the beam separation unit. The electrostatic deflection of the secondary charged particle beam may be an electrostatic deflection in one spatial dimension or an electrostatic deflection in two spatial dimensions.

The influence of the first magnetic field on the secondary charged particle beam may include a magnetic deflection of the secondary charged particle beam. The magnetic force generated by the first magnetic field may act on the secondary charged particle beam traveling through the beam separation unit, and cause a magnetic deflection of the secondary charged particle beam. The magnetic deflection of the secondary charged particle beam is, in first approximation, proportional to the strength of the first magnetic field and inversely proportional to the square root of the energy of the secondary charged particle beam passing through the beam separation unit. The magnetic deflection of the secondary charged particle beam may be a magnetic deflection in one spatial dimension or a magnetic deflection in two spatial dimensions.

The travel direction of the secondary charged particle beam leaving the beam separation unit may be aligned with a second target axis under the influence of the first electric field and the first magnetic field. The second target axis may extend through the beam separation unit and through the first optical component. The secondary charged particle beam may travel from the beam separation unit to the first optical component along the second target axis.

The first optical component may be arranged in a fixed position in the charged particle beam device. The relative position of the first optical component with respect to the beam separation unit may be fixed. The second target axis may be determined by the relative position or fixed relative position of the first optical component with respect to the beam separation unit.

According to some embodiments, which can be combined with other embodiments described herein, the first optical component is a beam bender for bending the secondary charged particle beam.

For example, the first optical component 210 shown in FIGS. 2-3 is a beam bender. A beam bender may e.g. be a hemispherical sector. A beam bender may be adapted for changing the direction of the secondary charged particle beam, so that the travel direction of the secondary charged particle beam entering the beam bender is different compared to the travel direction of the secondary charged particle beam leaving the beam bender. Specifically, the beam bender may be arranged to direct the secondary charged particle beam further away from the primary charged particle beam.

According to other embodiments, the first optical component is a secondary particle optics or part of a secondary charged particle optics, e.g. a lens or aperture.

According to still other embodiments, the first optical component may be a detector for detecting the secondary charged particle beam. The charged particle beam device may include a detector dome which includes secondary charged particle detectors. The first optical element may be a first detector of the secondary charged particle detectors of the detector dome, as further described elsewhere herein.

The secondary charged particle beam may travel from the beam separation unit to the first optical component along a first optical path. The first optical path may coincide or partly coincide with the second target axis. The first optical component may be arranged directly downstream of the beam separation unit with respect to the first optical path, for example if the first optical component is a beam bender. The first optical component may be the next optical element influencing the secondary charged particle beam along the first optical path. Alternatively, the first optical component may not be disposed directly downstream along the first optical path, for example if the first optical component is (part of) a secondary particle optics or a detector. There may be another optical element, for example a beam bender, influencing the secondary charged particle beam on the first optical path between the beam separation unit and the first optical component, before the secondary charged particle beam reaches the first optical component.

FIG. 3 shows the charged particle beam device 200 in which a second electric field 360 and a second magnetic field 370 are generated in the beam separation unit 230. In the embodiment shown, the second magnetic field 370 is different from the first magnetic field 270 and/or the second electric field 360 is different from the first electric field 260. In other words, in the embodiment shown in FIG. 3, at least one of the electric field and the magnetic field generated in the beam separation unit 230 is different compared to the embodiment shown in FIG. 2. Specifically, the field strength of the second electric field may be different from the field strength of the first electric field, but additionally or alternatively the direction and/or field geometry may be different. The field strength of the second magnetic field may be different from the field strength of the first magnetic field, but additionally or alternatively the direction and/or field geometry may be different.

As further shown in FIG. 3, the secondary charged particle beam 120 passes through the beam separation unit 230 in which the second electric field 360 and the second magnetic field 370 are generated. The influence of the second electric field 360 and the second magnetic field 370 result in a deflection of the secondary charged particle beam 120. Since the electric field and/or magnetic field generated in the beam separation unit 230 are different compared to the embodiment shown in FIG. 2, the secondary charged particle beam 120 shown in FIG. 3 is deflected in a different direction compared to the secondary charged particle beam shown in FIG. 2. In particular, the secondary charged particle beam 120 shown in FIG. 3 is deflected to travel from the beam separation unit 230 to the second optical component 220. Furthermore, even though the electric field and/or magnetic field generated in the beam separation unit have been adjusted, the field configuration is such that the primary charged particle beam 110 leaving the beam separation unit 230 still travels along the first target axis 250, as was the case in FIG. 2.

According to embodiments, the method further includes generating a second electric field and a second magnetic field in the beam separation unit. The second electric field may be different from the first electric field and/or the second magnetic field may be different from the first magnetic field. More specifically, a magnitude of the second electric field may be different from a magnitude of the first electric field and/or a magnitude of the second magnetic field may be different from a magnitude of the first magnetic field. Alternatively or in addition, the direction in which the second electric field is generated may be different from the direction in which the first electric field is generated and/or the direction in which the second magnetic field is generated may be different from the direction in which the first magnetic field is generated.

The method further includes guiding the primary charged particle beam through the beam separation unit in which the second electric field and the second magnetic field are generated, wherein a travel direction of the primary charged particle beam leaving the beam separation unit is aligned with the first target axis under the influence of the first electric field and of the first magnetic field. The primary charged particle beam travels along the first target axis upon leaving the beam separation unit. The travel direction of the primary charged particle beam leaving the beam separation unit may be determined by and/or be dependent on the second electric field and/or second magnetic field.

The primary charged particle beam may be deflected in the beam separation unit under the influence of the second electric field and/or of the second magnetic field. Accordingly, the travel direction of the primary charged particle beam leaving the beam separation unit may be different from the travel direction of the primary charged particle beam entering the beam separation unit. Alternatively, the second electric field and the second magnetic field may be such that the primary charged particle beam is not deflected in the beam separation unit. Accordingly, the travel direction of the primary charged particle beam entering the beam separation may coincide with the travel direction of the primary charged particle beam leaving the beam separation unit.

The influence of the second electric field on the primary charged particle beam may include an electrostatic deflection of the primary charged particle beam. The second electric field generates an electric force. The electric force may act on the primary charged particle beam traveling through the beam separation unit, and cause an electrostatic deflection of the charged particle beam in the beam separation unit. The electrostatic deflection of the primary charged particle beam is, in first approximation, proportional to the strength of the second electric field and inversely proportional to the energy of the primary charged particle beam travelling through the beam separation unit. The electrostatic deflection of the primary charged particle beam may be an electrostatic deflection in one spatial dimension or an electrostatic deflection in two spatial dimensions.

The influence of the second magnetic field on the primary charged particle beam may include a magnetic deflection of the primary charged particle beam. The second magnetic field generates a magnetic force. The magnetic force may act on the primary charged particle beam traveling through the beam separation unit, and cause a magnetic deflection of the primary charged particle beam. The magnetic deflection of the primary charged particle beam is, in first approximation, proportional to the strength of the second magnetic field and inversely proportional to the square root of the energy of the primary charged particle beam passing through the beam separation unit. The magnetic deflection of the primary charged particle beam may be a magnetic deflection in one spatial dimension or a magnetic deflection in two spatial dimensions.

A direction in which the second electric field is generated and/or a direction in which the second magnetic field is generated may be perpendicular or substantially perpendicular to the optical axis defined by the beam separation unit, at least in the region where the primary charged particle beam passes through the first electric field. The second electric field may be a homogeneous second electric field. The second magnetic field may be a homogeneous or a substantially homogeneous second magnetic field, at least in the region where the primary charged particle beam passes through the first electric field. The second electric field may be perpendicular or substantially perpendicular to the second magnetic field. Here, the term "substantially perpendicular" means a tolerance of less than or equal to ±10°, in particular less than or equal to ±5°.

The method further includes separating the secondary charged particle beam from the primary charged particle beam in the beam separation unit, wherein the secondary charged particle beam is deflected under the influence of the second electric field and the second magnetic field to travel from the beam separation unit to the second optical component. The travel direction of the secondary charged particle beam leaving the beam separation unit may be determined by, or be dependent on, the second electric field and/or the second magnetic field. The travel direction of the secondary charged particle beam leaving the beam separation unit may be different from the travel direction of the secondary charged particle beam entering the beam separation unit. The travel direction of the secondary charged particle beam leaving the beam separation unit in which the second electric field and the second magnetic field are generated is different from the travel direction of the secondary charged particle beam leaving the beam separation unit in which the first electric field and the first magnetic field are generated.

The influence of the second electric field on the secondary charged particle beam may include an electrostatic deflection of the secondary charged particle beam. The electric force generated by the second electric field may act on the secondary charged particle beam traveling through the beam separation unit, and cause an electrostatic deflection of the secondary charged particle beam in the beam separation unit. The electrostatic deflection of the secondary charged particle beam is, in first approximation, proportional to the strength of the second electric field and inversely proportional to the energy of the secondary charged particle beam travelling through the beam separation unit. The electrostatic deflection of the secondary charged particle beam may be an electrostatic deflection in one spatial dimension or an electrostatic deflection in two spatial dimensions.

The influence of the second magnetic field on the secondary charged particle beam may include a magnetic deflection of the secondary charged particle beam. The magnetic force generated by the second magnetic field may act on the secondary charged particle beam traveling through the beam separation unit, and cause a magnetic deflection of the secondary charged particle beam. The magnetic deflection of the secondary charged particle beam is, in first approximation, proportional to the strength of the second magnetic field and inversely proportional to the square root of the energy of the secondary charged particle beam passing through the beam separation unit. The magnetic deflection of the secondary charged particle beam may be a magnetic deflection in one spatial dimension or a magnetic deflection in two spatial dimensions.

The travel direction of the secondary charged particle beam leaving the beam separation unit may be aligned with a third target axis under the influence of the second electric field and the second magnetic field. The third target axis may be different from the second target axis. The third target axis may extend through the beam separation unit and the second optical component. The secondary charged particle beam may travel from the beam separation unit to the second optical component along the third target axis.

The second optical component may be arranged in a fixed position in the charged particle beam device. The relative position of the second optical component with respect to the beam separation unit may be fixed. The third target axis may be determined by the relative position or fixed relative position of the second optical component with respect to the beam separation unit.

The distance from the first optical component to the optical axis defined by the beam separation unit in a direction perpendicular to the optical axis may be the same as the distance from the second optical component to the optical axis in a direction perpendicular to the optical axis.

According to some embodiments, which can be combined with other embodiments described herein, the second optical component is a beam bender for bending the secondary charged particle beam.

For example, the second optical component 220 shown in FIGS. 2-3 is a beam bender. According to other embodiments, the second optical component is a secondary particle optics or part of a secondary charged particle optics, e.g. a lens or aperture. According to still other embodiments, the second optical component may be a detector for detecting the secondary charged particle beam. In particular, the second optical component may be a second detector of the secondary charged particle detectors of the detector dome.

The secondary charged particle beam may travel from the beam separation unit to the second optical component along a second optical path. The second optical path may coincide or partly coincide with the second target axis. The second optical path may be different from or disjoint from the first optical path. The second optical path may be distanced from the first optical path. The second optical component may be arranged directly downstream of the beam separation unit with respect to the second optical path, for example if the second optical component is a beam bender. The second optical component may be the next optical element influencing the secondary charged particle beam along the second optical path. Alternatively, the second optical component may not be disposed directly downstream along the second optical path, for example if the second optical component is (part of) a secondary particle optics or a detector. There may be another optical element, for example a beam bender, influencing the secondary charged particle beam on the second optical path between the beam separation unit and the second optical component, before the secondary charged particle beam reaches the second optical component.

The relative positions of the second optical component with respect to the beam separation unit and with respect to the first optical component may be such that the first optical component, the second optical component and the beam separation unit form the corners of a triangle and/or are non-collinear. The second optical component may be distanced from a plane extending through the beam separation unit, through the first optical component and through a beam emitter included in the charged particle beam device.

The first electric field, the second electric field, the first magnetic field and/or the second magnetic field may be dipole fields. The dipole fields may be generated by one or more dipole elements, may be generated by one or more quadrupole elements and/or may be generated by one or more n-th order multi-pole elements with $n \geq 8$.

Embodiments described herein thus allow changing the direction in which the secondary charged particle beam is deflected in the beam separation unit by adjusting the electric field and/or the magnetic field generated in the beam separation unit. Accordingly, the secondary charged particle beam may be directed, e.g. at a first moment in time, to travel from the beam separation unit to the first optical component and, e.g. at a later moment in time, to travel from the beam separation unit to the second optical component distanced from the first optical component. Accordingly, space for arranging the first optical component and the second optical component in the charged particle beam device is made available.

Furthermore, by suitably adjusting the electric field and the magnetic field generated in the beam separation unit, the travel direction of the primary charged particle beam leaving the beam separation unit can be kept constant, so that the primary charged particle beam travels from the beam separation unit in alignment with the first target axis independently of the deflection direction of the secondary charged particle beam. The first target axis may e.g. have been preselected in dependence of a target inclination angle of the primary charged particle beam onto the sample.

FIGS. 4 and 5 provide a top view of a charged particle beam device in different states of operation according to embodiments described herein. The fields 260, 270, 360 and 370 shown in FIGS. 4-5, and also in FIGS. 7-8 discussed below, are schematic illustrations which are not intended to represent actual field configurations.

The beam separation unit 230 shown in FIGS. 4-5 defines an optical axis 490 which, as indicated, coincides with the first target axis 250. The optical axis 490 extends perpendicularly to the drawing plane, so that the optical axis 490 is represented by a dot. A first plane 410 contains the optical axis 490 and extends through the first optical component 210. A second plane 420 contains the optical axis 490 and extends through the second optical component 220. In FIGS. 4 and 5, the first plane 410 extends through the center of the first optical component 210, e.g., an axis or plane of symmetry of the first optical component, and the second plane 420 extends through the center of the second optical component 220, e.g., an axis or plane of symmetry of the second optical component. In the top view of FIGS. 4 and 5, the first plane 410, which extends perpendicularly to the drawing plane, is represented as a first line. Similarly, the second plane 420 extends perpendicularly to the drawing plane and is represented as a second line. The second plane 420 and the first plane 410 intersect with each other, the intersection being formed by the optical axis 490. An azimuthal angle 430 exists between the first plane 410 and the second plane 420.

The secondary charged particle beam 120 shown in FIG. 4 is deflected in the beam separation unit 230 to travel from the beam separation unit 230 to the first optical component 210 under the influence of the first electric field 260 and of the first magnetic field 270. In the exemplary embodiment shown, the first electric field 260 has two spatial components, namely an x-component 261 defined with respect to x-direction 450 as a reference and a y-component 262 defined with respect to a y-direction 460 as a reference. The first electric field 260 is a superposition, more particularly a vectorial sum, of the x-component 261 and the y-component 262. The x-direction 450 is perpendicular to the y-direction 460, and both the x-direction 450 and the y-direction 460 are perpendicular to the optical axis 490. The first magnetic field 270 has two spatial components as well, namely an x-component 271 and a y-component 272. The first magnetic field 270 is a superposition, more particularly a vectorial sum, of the x-component 271 and the y-component 272. The first electric field 260 and the first magnetic field 270, both having an x-component and a y-component, are able to influence the travel direction of the primary charged particle beam and of the secondary charged particle beam with respect to both the x-direction 450 and with respect the y-direction 460. The field configuration of the first electric field 260 and of the first magnetic field 270 is such that the secondary charged particle beam 120 is deflected to travel from the beam separation unit 230 to the first optical component 210 in a well-aligned way. In particular, in the exemplary embodiment shown, the secondary charged particle beam 120 travels within the first plane 410 to the first optical component 210. At the same time, the field configuration of the first electric field 260 and of the first magnetic field 270 is such that the primary charged particle beam 110 travels along the first target axis 250 upon leaving the beam separation unit 230. Here, the primary charged particle beam is not deflected in x-direction, but stays in the y-z-plane.

The secondary charged particle beam 120 shown in FIG. 5 is deflected in the beam separation unit 230 to travel from the beam separation unit 230 to the second optical component 220 under the influence of the second electric field 360 and of the second magnetic field 370. The second electric field 360 has two spatial components, namely an x-component 361 and a y-component 362. The second electric field 360 is a superposition, more particularly a vectorial sum, of the x-component 361 and the y-component 362. The second magnetic field 370 has two spatial components as well, namely an x-component 371 and a y-component 372. The second magnetic field 370 is a superposition, more particularly a vectorial sum, of the x-component 371 and the y-component 372. The field configuration of the second electric field 360 and the second magnetic field 370 is such that the secondary charged particle beam 120 is deflected to travel from the beam separation unit 230 to the second optical component 220 in a well-aligned way. In particular, in the exemplary embodiment shown, the secondary charged particle beam 120 travels within the second plane 420 to the second optical component 220. At the same time, the field configuration of the second electric field 360 and the second magnetic field 370 is such that the primary charged particle beam 110 still travels along the first target axis 250 upon leaving the beam separation unit 230. Again, the primary charged particle beam is not deflected in x-direction, but stays in the y-z-plane in this embodiment.

According to some embodiments, which can be combined with other embodiments described herein, the beam separation unit defines an optical axis and an azimuthal angle exists between a first plane and a second plane. The first plane contains the optical axis and may extend through the first optical component, and the second plane contains the optical axis and may extend through the second optical component. The first optical component may be distanced from the second plane and/or the second optical component may be distanced from the first plane. The first plane may be different from the second plane. The first plane may extend through a center of the first optical component, and may, e.g., contain a symmetry axis or plane of the first optical component. The second plane may extend through a center of the second optical component, and may, e.g., contain a symmetry axis or plane of the second optical component. The azimuthal angle may lie in the range from 5 to 145 degrees, more particularly from 10 to 100 degrees, still more particularly from 25 to 60 degrees. The azimuthal angle may, e.g. be about 45 degrees. An azimuthal angle may provide for a sufficient distance between the first optical component and the second optical component, for instance between a first beam bender and a second beam bender, and also between subsequent secondary charged particle optics and respective detectors.

Embodiments described herein thus provide a charged particle beam device wherein the secondary charged particle beam may travel away from the beam separation unit in different planes. Compared to systems wherein the primary charged particle beam and the secondary charged particle beam are restricted to travel within a single plane, embodiments described herein thus provide additional space for arranging secondary charged particle optics and/or detectors in the charged particle beam device. In fact, a three-dimensional region above the sample or objective lens is thus made available for arranging multiple secondary charged particle optics and/or detectors, and the detectors may be arranged to form a detector dome.

The first electric field may have two adjustable degrees of freedom, in particular two adjustable spatial components. The first electric field may have a spatial component, in particular an adjustable spatial component, defined with respect to a first reference direction, such as e.g. x-component 261 defined with respect to x-direction 450 shown in FIG. 4. The first reference direction may be perpendicular to the optical axis defined by the beam separation unit. The first electric field may have a spatial component, in particular an adjustable spatial component, defined with respect to a second reference direction, such as e.g. y-component 262 defined with respect to y-direction 460 shown in FIG. 4. The second reference direction may be perpendicular to the optical axis defined by the beam separation unit and/or and to the first reference direction.

The first magnetic field may have two adjustable degrees of freedom, in particular two adjustable spatial components. The first magnetic field may have a spatial component, in particular an adjustable spatial component, defined with respect to a third reference direction, such as e.g. x-component 271 defined with respect to x-direction 450 shown in FIG. 4. The third reference direction may be the same as the first reference direction. For example, in the embodiments shown in FIGS. 4-5, both the third reference direction and the first reference direction may coincide with the x-direction 450. The third reference direction may be perpendicular to the optical axis defined by the beam separation unit. The first magnetic field may have a spatial component, in particular an adjustable spatial component, defined with respect to a fourth reference direction, such as e.g. y-component 272 defined with respect to y-direction 460 shown in FIG. 4. The fourth reference direction may be the same as the second reference direction. For example, in the embodiments shown in FIGS. 4-5, both the fourth reference direction and the second reference direction may coincide with the y-direction 460. The fourth reference direction may be perpendicular to the optical axis defined by the beam separation unit and/or to the third reference direction.

The second electric field may have two adjustable degrees of freedom, in particular two adjustable spatial components. The second electric field may have a spatial component, in particular an adjustable spatial component, defined with respect to the first reference direction, such as e.g. x-component 361 defined with respect to x-direction 450 shown in FIG. 5. The second electric field may have a spatial component, in particular an adjustable spatial component, defined with respect to the second reference direction, such as e.g. y-component 362 defined with respect to y-direction 460 shown in FIG. 5.

The second magnetic field may have two adjustable degrees of freedom, in particular two adjustable spatial components. The second magnetic field may have a spatial component, in particular an adjustable spatial component, defined with respect to the third reference direction, such as e.g. x-component 371 defined with respect to x-direction 450 shown in FIG. 5. The second magnetic field may have a spatial component, in particular an adjustable spatial component, defined with respect to the fourth reference direction, such as e.g. y-component 372 defined with respect to y-direction 460 shown in FIG. 5.

The first electric field, the second electric field, the first magnetic field, the second magnetic field, as well as a third electric field and a third magnetic field according to embodiments described below, may be generated by a beam separation unit of two-dimensional Wien filter type. A beam separation unit of two-dimensional Wien filter type is configured to generate an electric field and a magnetic field which can have any orientation in the plane perpendicular to the optical axis defined by the beam separation unit, wherein the electric field and the magnetic field may be perpendicular to each other. With respect to a given coordinate system, such as the coordinate system with x-axis 450 and y-axis 460 shown in FIGS. 4 and 5, the first electric field, the second electric field, the first magnetic field, the second magnetic field, the third electric field and the third magnetic field generated by the beam separation unit of two-dimensional Wien filter type have two spatial components, one in x-direction and one in y-direction. Examples of beam separation units of Wien filter type will be described with respect to FIGS. 12 and 13.

According to some embodiments, which can be combined with other embodiments described herein, the first optical component is distanced from a sample plane by a first distance in a direction perpendicular to the sample plane, and the second optical component is distanced from the sample plane by a second distance in the direction perpendicular to the sample plane. The second distance may be different from the first distance.

Figure 6:
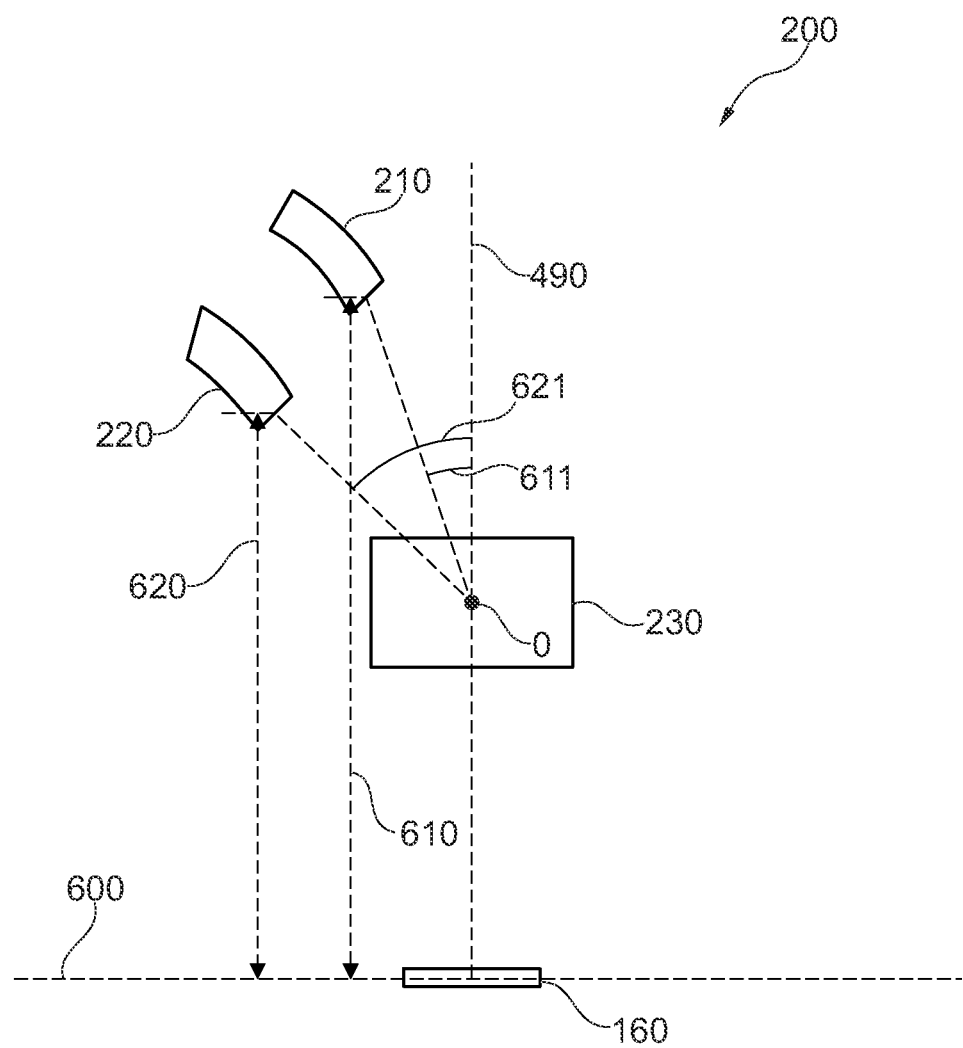
FIG. 6 provides a side view of a charged particle beam device according to embodiments described herein.

FIG. 6 provides a side view of an embodiment of a charged particle beam device, wherein the first optical component 210 is distanced from a sample plane 600 by a first distance 610 in a direction perpendicular to the sample plane, and the second optical component 220 is distanced from the sample plane by a second distance 620 in the direction perpendicular to the sample plane. The sample plane runs through the sample 160 or is at least parallel to the sample 160. The sample plane may be defined by a sample holder (not shown) which holds the sample 160, e.g., by an upper surface of the sample holder. The sample plane 600 shown in FIG. 6 is perpendicular to the optical axis 490. The first distance 610 is different from the second distance 620. Accordingly, the first optical component 210 is arranged at a different height, in particular at a greater height, above the sample 160 compared to the second optical component 220. In other words, when taking a point O on the optical axis 490 at the center of the beam separation unit 230 as the origin of a spherical coordinate system, the polar angle 611 between the optical axis 490 and the line connecting the point O to the first optical component 210 is different from the polar angle 621 between the optical axis 490 and the line connecting the point O to the second optical component 220. The azimuthal angles of the first optical component 210 and of the second optical component 220 in this spherical coordinate system cannot be seen in the side view of FIG. 6. The azimuthal angles may be the same (and so the first optical component 210 and the second optical component 220 lie in one plane) or may be different, such as the embodiments shown in FIGS. 4 and 5 where a relative azimuthal angle larger than zero, shown as azimuthal angle 430, exists between the first optical component 210 and the second optical component.

According to some embodiments, the sample plane may extend through the sample and/or be perpendicular to the optical axis defined by the beam separation unit. The sample plane may be parallel to a surface of the sample, in particular to the surface which is inspected and/or structured by the charged particle beam device. The sample plane may be defined by sample support, in particular by the surface of the sample support that is supporting the sample, such as an upper surface thereof. The sample plane may coincide with or be parallel to a plane along which the sample is transported into and/or out of the charged particle beam device. The first optical component may be arranged at the same side of the sample plane as the second optical component. The direction perpendicular to the sample plane may be parallel to the optical axis defined by the beam separation unit. The first distance may be a vertical distance and/or the second distance may be a vertical distance. The first distance may be a first height above the sample or sample plane. The second distance may be a second height above the sample or sample plane.

According to some embodiments, which can be combined with other embodiments described herein, the first electric field may be generated in dependence of the relative position of the first optical component with respect to the beam separation unit, in dependence of the first distance and/or in dependence of an azimuthal angle between the first plane and a zero plane containing the optical axis defined by the beam separation unit. The zero plane is chosen arbitrarily to fix a coordinate system. Referring to FIG. 4, the zero plane may, for example, refer to the zero plane 440. As shown, the zero plane 440 contains the optical axis 490 and the primary charged particle beam 110 travels in the zero plane 440 upon entering the beam separation unit 230. In the embodiment shown in FIG. 4, the azimuthal angle between the first plane 410 and the zero plane 440 may, for example, be the angle 441.

The magnitude of the first electric field and/or the direction in which the first electric field is generated may depend on or be determined by the relative position of the first optical component with respect to the beam separation unit, the first distance and/or the azimuthal angle between the first plane and the zero plane.

According to some embodiments, which can be combined with other embodiments described herein, the first magnetic field may be generated in dependence of the relative position of the first optical component with respect to the beam separation unit, in dependence of the first distance and/or in dependence of the azimuthal angle between the first plane and the zero plane. The magnitude of the first magnetic field and/or the direction in which the first magnetic field is generated may depend on or be determined by the relative position of the first optical component with respect to the beam separation unit, the first distance and/or the azimuthal angle between the first plane and the zero plane.

According to some embodiments, which can be combined with other embodiments described herein, the second electric field may be generated in dependence of the relative position of the second optical component with respect to the beam separation unit, in dependence of the second distance and/or in dependence of an azimuthal angle between the second plane and the zero plane. In the embodiment shown in FIG. 5, the azimuthal angle between the second plane 420 and the zero plane 440 may, for example, be the angle 442.

The magnitude of the second electric field and/or the direction in which the second electric field is generated may depend on or be determined by the relative position of the second optical component with respect to the beam separation unit, the second distance and/or the azimuthal angle between the second plane and the zero plane.

According to some embodiments, which can be combined with other embodiments described herein, the second magnetic field may be generated in dependence of the relative position of the second optical component with respect to the beam separation unit, in dependence of the second distance and/or in dependence of the azimuthal angle between the second plane and the zero plane. The magnitude of the second magnetic field and/or the direction in which the second magnetic field is generated may depend on or be determined by the relative position of the second optical component with respect to the beam separation unit, the second distance and/or the azimuthal angle between the second plane and the zero plane.

According to some embodiments, which can be combined with other embodiments described herein, the charged particle beam device includes a detector dome including secondary charged particle detectors. A secondary charged particle detector is adapted for detecting the secondary charged particle beam. When the secondary charged particle beam leaves the beam separation unit in different travel directions, depending on the field configuration of the beam separation unit, the secondary charged particle beam can be directed to different secondary charged particle detectors at different times to be detected there. The secondary charged particle detectors included in the detector dome may be a plurality of secondary charged particle detectors, such as 2-20 secondary charged particle detectors, e.g., 2, 3, 4, 6, 8, 12 or 16 secondary charged particle detectors. The secondary charged particle detectors include a first detector and a second detector. The second detector is distanced from the first detector. The first detector may be arranged at the same distance from the optical axis as the second detector, or may be arranged at a different distance. Further detectors of the detector dome are distanced from respective other detectors and may be arranged at the same distance to the optical axis or at different distances.

Figure 7:
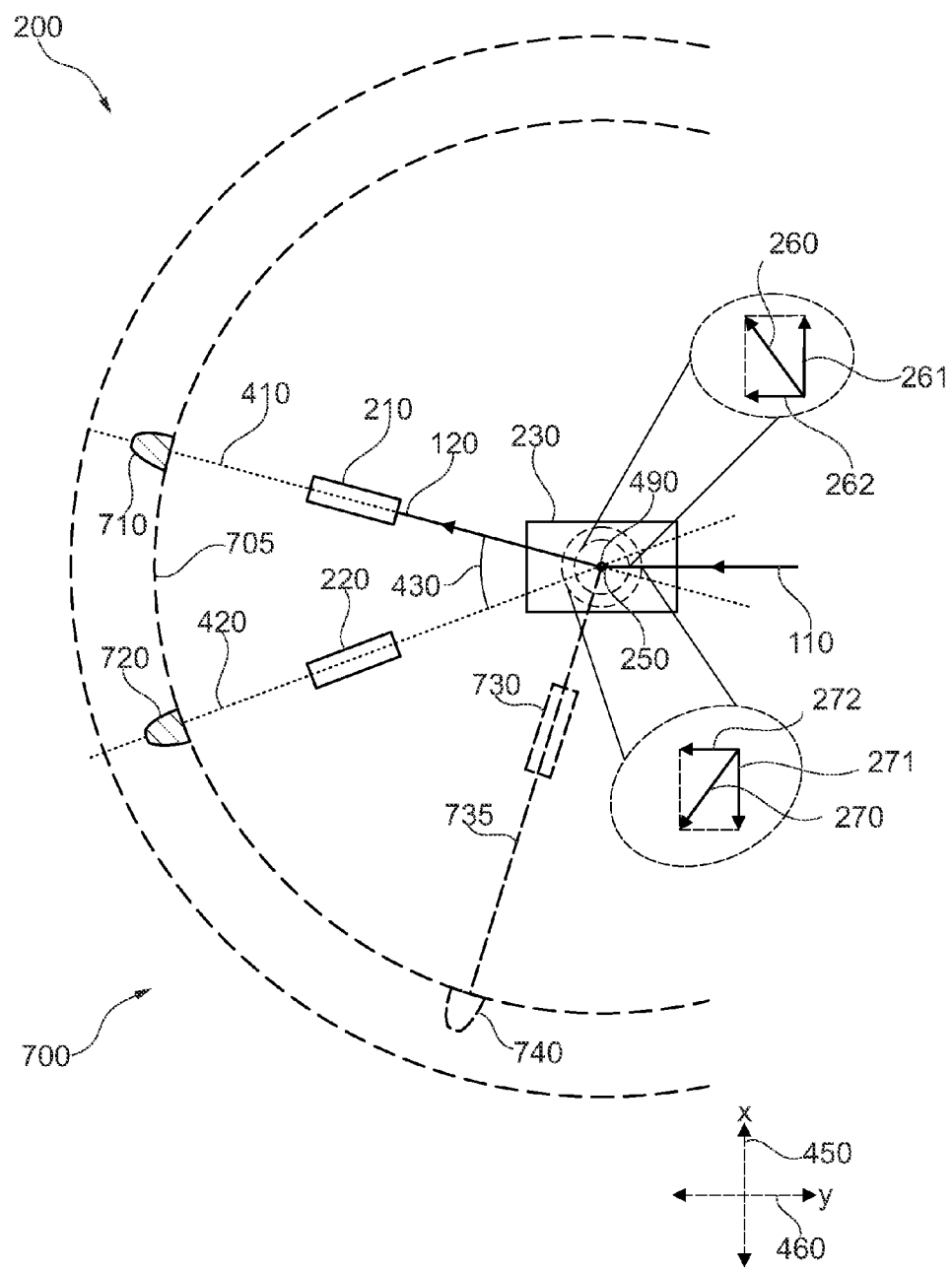
Figure 8:
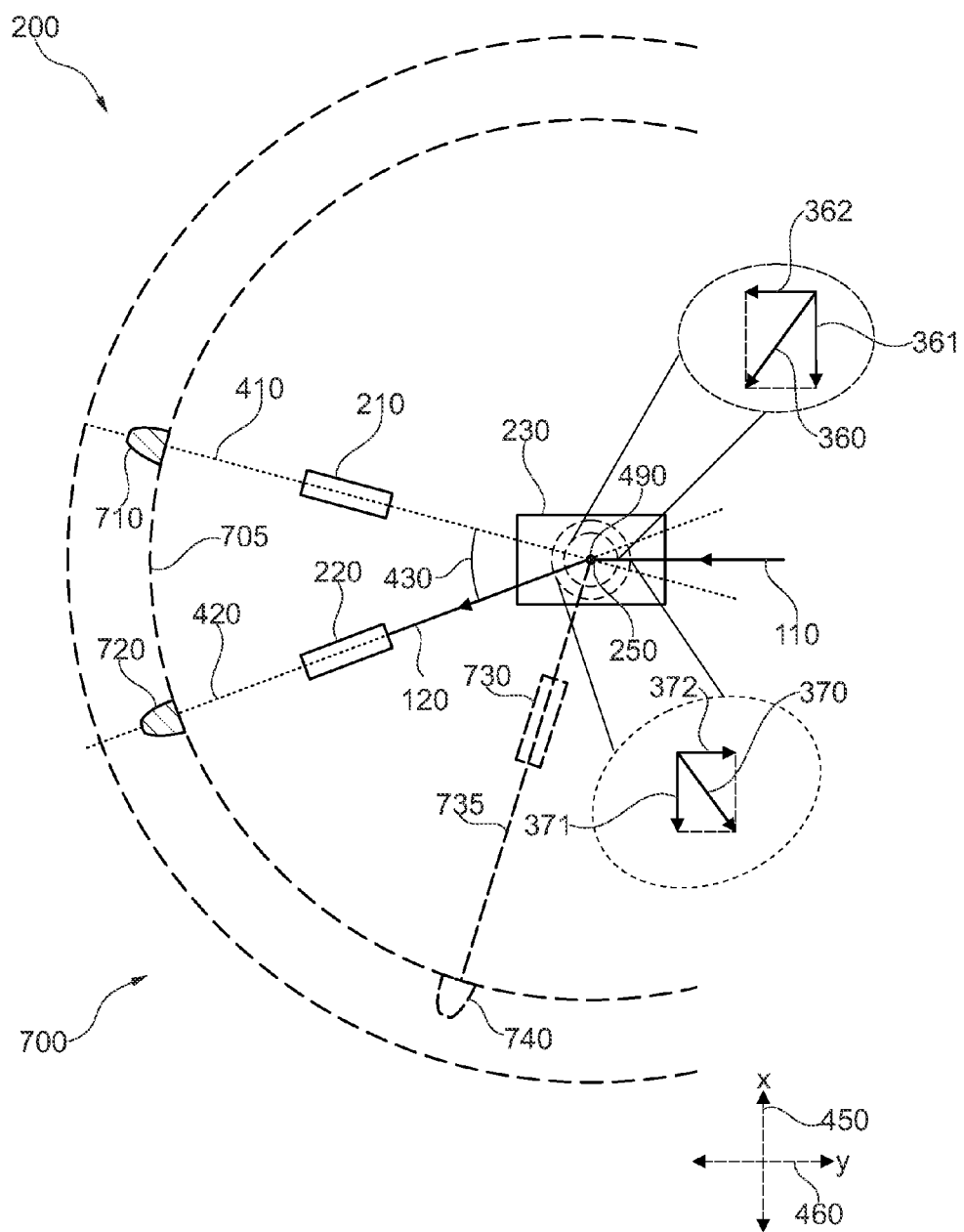

FIGS. 7-8 provide a top view of an embodiment of a charged particle beam device. The charged particle beam device 200 includes a detector dome 700. The detector dome 700 includes a first detector 710 and a second detector 720. In the exemplary embodiment shown, the first plane 410 contains the optical axis 490, extends through the first detector 710 and extends through the first optical component 210. The second plane 420 contains the optical axis 490, extends through the second detector 720 and extends through the second optical component 220. The detector dome 700 may include further detectors. For instance, the detector dome 700 may include a third detector 740, shown in dashed lines. A third plane 735 containing the optical axis 490 extends through the third detector 740 and through a third optical component 730. The third plane 735 forms a (relative) azimuthal angle larger than zero with respect to the first plane 410, and forms a (relative) azimuthal angle larger than zero with respect to the second plane 420.

As shown in FIG. 7, the secondary charged particle beam 120 is deflected in the beam separation unit 230 under the influence of the first electric field 260 and the first magnetic field 270. The deflected secondary charged particle beam 120 travels from the beam separation unit 230 to the first detector 710 via the first optical component 210, wherein the secondary charged particle beam 120 travels within the first plane 410. The secondary charged particle beam 120 is detected by the first detector 710 at a detection side 705 of the detector dome 700.

As shown in FIG. 8, the secondary charged particle beam 120 is deflected in the beam separation unit 230 under the influence of the second electric field 360 and the second magnetic field 370. The deflected secondary charged particle beam 120 travels from the beam separation unit 230 to the second detector 720 via the second optical component 220, wherein the secondary charged particle beam 120 travels within the second plane 420. The secondary charged particle beam 120 is detected by the second detector 720 at the detection side 705 of the detector dome 700.

The beam separation unit 230 may generate a third electric field and a third magnetic field and deflect the secondary charged particle beam 120 so that the secondary charged particle beam 120 travels to the third detector 740 via the third optical component 730, wherein the secondary charged particle beam 120 travels in the third plane 735. The field configuration of the electric field and of the magnetic field in the beam separation unit can be formed such that the path of the primary charged particle beam is unaffected when the secondary charged particle beam 120 is deflected towards the respective optical components and/or detectors. The detector dome 700 shown in FIGS. 7-8 thus allows detecting the secondary charged particle beam 120 traveling away from the beam separation unit 230 in different directions, in particular in different azimuthal directions.

According to some embodiments, which can be combined with other embodiments described herein, the method further includes guiding the secondary charged particle beam from the first optical component to the first detector and detecting the secondary charged particle beam with the first detector. The first optical component may be arranged, with respect to the first optical path of the secondary charged particle beam, downstream of the beam separation unit and upstream of the first detector. The secondary charged particle beam may travel from the first optical component to the first detector along a straight line, but may be shaped by lenses or apertures. The first plane may contain the optical axis defined by the beam separation unit, may extend through the first optical component and/or may extend through the first detector.

According to some embodiments, which can be combined with other embodiments described herein, the method further includes guiding the secondary charged particle beam from the second optical component to the second detector and detecting the secondary charged particle beam with the second detector. The second optical component may be arranged, with respect to the second optical path of the secondary charged particle beam, downstream of the beam separation unit and upstream of the second detector. The secondary charged particle beam may travel from the second optical component to the second detector along a straight line, but may be shaped by lenses or apertures. The second plane may contain the optical axis defined by the beam separation unit, may extend through the second optical component and/or may extend through the second detector.

The secondary charged particle detectors of the detector dome may be an array of secondary charged particle detectors, in particular a two-dimensional array of secondary charged particle detectors. The array of secondary charged particle detectors may be arranged on a curved surface, in particular a spherical surface. The secondary charged particle detectors may be arranged at substantially equal distances from the beam separation unit. The first detector and the second detector may be arranged at substantially equal distances from the beam separation unit. Accordingly, the distance traveled by the secondary charged particle beam from the beam separation unit to the first detector may be substantially the same as the distance traveled by the secondary charged particle beam from the beam separation unit to the second detector. Here, the terms "at substantially equal distances" or "substantially the same distance" mean that the ratio of the two distances that are compared is in the range from 0.95 to 1.05.

The first detector, the second detector and/or the secondary charged particle detectors of the detector dome may be distanced from a beam emitter included in the charged particle beam device. The first detector, the second detector and/or the detector dome may be arranged above an objective lens included in the charged particle beam device. The first detector, the second detector and/or the detector dome may be arranged opposite of a sample side of the objective lens. The first detector, the second detector and/or the detector dome may be arranged above the beam separation unit, i.e., at a side of the beam separation unit opposite to the side where the sample plane is.

The spatial arrangement of the detector dome in the charged particle beam device may be fixed. The spatial arrangement of the first detector, the second detector and/or the secondary charged particle detectors in the detector dome may be fixed. The first detector may be separated from the second detector.

The first detector and the second detector may be independent detectors. The first detector may be adapted for detecting a first property of the secondary charged particle beam device. The secondary detector may be adapted for detecting a second property of the secondary charged particle beam, wherein the second property is different from the first property. Further detectors may be adapted to detect yet further, different properties. In other words, the first detector, the second detector and any further detector, if present, may be detectors of different types and/or be used for different purposes. The first detector, the second detector and any further detector of the detector dome may be of a type selected from the group including or consisting of: scintillator detectors; pin diode based detectors; array detector arrangements; detector arrangements for energy analysis; retarding field analyzers; or energy dispersive analyzers. The first detector, the second detector and any further detector of the detector dome may each be configured as one of dedicated secondary electron detectors for low probe currents, dedicated secondary electron detectors for high probe currents, back-scattered electron detectors and energy filter detectors. For example, the first detector may be a scintillator detector dedicated for detecting low probe currents of secondary electrons and the second detector may be a pin diode based detector for detecting high probe currents of secondary electrons. As a further example, a third detector may be a retarding field analyzer dedicated for energy analysis SE analysis, BSE analysis or Auger electron analysis, wherein, BSE energy analysis may e.g. be used for material characterization.

Embodiments described herein thus allow for an assembly of multiple secondary charged particle detectors to be included in the charged particle beam device. Having multiple detectors provides the advantage that multiple distinct properties of the secondary charged particle beam can be detected. In high performance tools, in particular tools designed for wafer and/or mask inspection, for defect review or for metrology, a large number of detectors are particularly advantageous, e.g., scintillator detectors as dedicated SE-detectors for low probe currents pin diode based detectors for high probe currents as well as BSE-detectors and energy filter detectors.

FIG. 9 provides a top view of an embodiment of a charged particle beam device. The charged particle beam device 200 includes a beam emitter 101, a beam separation unit 230 and a detector dome 700 including secondary charged particle detectors, the secondary charged particle detectors including a first detector 710 and a second detector 720. The first detector 710 is arranged downstream, with respect to a first optical path 910, of the beam separation unit 230. The first optical path 910 may be the path along which the secondary charged particle beam travels if e.g. the first electric field and the first magnetic field are generated in the beam separation unit 230 according to embodiments described herein. The second optical path 920 may be the path along which the secondary charged particle beam travels if e.g. the second electric field and the second magnetic field are generated in the beam separation unit 230 according to embodiments described herein. In the exemplary embodiment shown in FIG. 9, the first optical path 910 is contained in the first plane 410 and the second optical path 920 is contained in the second plane 420, wherein an azimuthal angle 430 exists between the first plane 410 and the second plane 420. Accordingly, the first optical path 910 is disjoint from the second optical path 920.

FIG. 10 shows a charged particle beam device according to a further embodiment. A first reference axis 1010 extends through the beam separation unit 230 and through the first detector 710. The first reference axis 1010 is contained in the first plane 410. A first polar angle 1011 exists between the optical axis 490 and the first reference axis 1010. FIG. 10 further shows a second reference axis 1020 extending through the beam separation unit 230 and through the second detector 720. The second reference axis 1020 is contained in the second plane 420. A second polar angle 1021 exists between the optical axis 490 and the second reference axis 1020. In the embodiment shown in FIG. 10, the second polar angle 1021 is the same as the first polar angle 1011. The first detector 710 and the second detector 720 are thus symmetrically arranged with respect to the beam separation unit 230 at equal polar angles relative to the optical axis 490. Alternatively, the first polar angle and the second polar angle could be different.

The detector dome 700 may include a third detector 740 in addition to the first detector 710 and the second detector 720. A third reference axis 1060 extends through the beam separation unit 230 and through the third detector 740. The third reference axis 1060 is contained in a third plane which coincides with the second plane 420. A third polar angle 1061 exists between the optical axis 490 and the third reference axis 1060. The third polar angle 1061 is different from the second polar angle 1021. Similarly, a fourth detector (not shown) could be arranged in the first plane, and a reference axis through the fourth detector and through the beam separation unit would make a fourth polar angle with respect to the optical axis 490, the fourth polar angle being different from the first polar angle 1011.

In the exemplary embodiment shown in FIG. 10, the first optical path 910 could be a straight line coinciding with a segment of the first reference axis 1010 between the beam separation unit 230 and the first detector 710. Accordingly, under normal operation conditions, the secondary charged particle beam traveling from the beam separation unit 230 to the first detector 710 would travel along the first reference axis 1010. Alternatively, specifically if there are further optical components between the first detector 710 and the beam separation unit 230, such as a beam bender and/or secondary charged particle optics, the first optical path may be curved at least in parts and not coincide with the first reference axis 1010. Similarly, the second optical path 920 shown in FIG. 10 could be a straight line coinciding with a segment of the second reference axis 1020 between the beam separation unit 230 and the second detector 720. Accordingly, under normal operation conditions, the secondary charged particle beam traveling from the beam separation unit 230 to the second detector 720 would travel along the second reference axis 1020. Alternatively, specifically if there are further optical components between the second detector 720 and the beam separation unit 230, such as a beam bender and/or secondary charged particle optics, the second optical path may be curved at least in parts and not coincide with the first reference axis 1010. Similar properties may hold for the third, fourth or any further detectors.

According to some embodiments, which can be combined with other embodiments described herein, a first polar angle exists between the optical axis defined by the beam separation unit and a first reference axis, the first reference axis being contained in the first plane and extending through the beam separation unit and through the first detector. The first polar angle may lie in the range from 0 to 45 degrees, more particularly from 0 to 30 degrees, still more particularly from 0 to 20 degrees. According to embodiments, a second polar angle exists between the optical axis and a second reference axis, the second reference axis being contained in the second plane and extending through the beam separation unit and through the second detector. The second polar angle may lie in the range from 0 to 45 degrees, more particularly from 0 to 30 degrees, still more particularly from 0 to 20 degrees.

The second polar angle may be the same as the first polar angle. In particular, a magnitude of the first polar angle may be equal to a magnitude of the second polar angle. Alternatively, the second polar angle may be different from the first polar angle. The difference between the first polar angle and the second polar angle may lie in the range from 0 to 45 degrees, more particularly from 0 to 30 degrees, still more particularly from 0 to 20 degrees.

Figure 11:
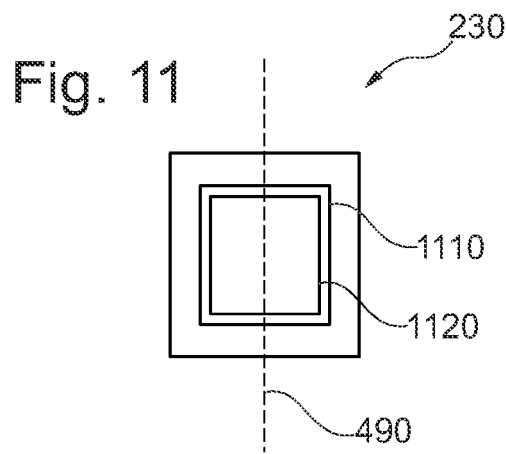
FIG. 11 provides a side view of a beam separation unit including a first E×B arrangement and a second E×B arrangement according to embodiments described herein.

FIG. 11 provides a side view of an exemplary embodiment of a beam separation unit of two-dimensional Wien-filter type according to embodiments. The beam separation unit 230 shown in FIG. 11 includes a first E×B arrangement 1110 and a second E×B arrangement 1120. The first E×B arrangement 1110 and the second E×B arrangement 1120 are each of one-dimensional Wien filter type, creating perpendicular electric and magnetic fields. The first E×B arrangement 1110 and the second E×B arrangement are of the same or similar construction, but oriented differently, namely at a 90° angle with respect to each other. The first E×B arrangement 1110 and the second E×B arrangement 1120 are arranged at the same position along the optical axis 490. The first E×B arrangement 1110 and the second E×B arrangement 1120 create their respective electric and magnetic field components in the same spatial area. The vertically oriented optical axis 490 may be a symmetry axis of the beam separation unit 230, specifically an axis of 90° rotational symmetry.

The beam separation unit 230 shown in FIG. 11 is adapted for generating an electric field and a magnetic field. The electric field generated by the beam separation unit 230 is a superposition of an electric field component generated by the first E×B arrangement 1110 and of an electric field component generated by the second E×B arrangement 1120. The magnetic field generated by the beam separation unit 230 is a superposition of a magnetic field component generated by the first E×B arrangement 1110 and of a magnetic field component generated by the second E×B arrangement 1120.

Alternatively, the first E×B arrangement 1110 and the second E×B arrangement 1120 may be arranged sequentially along the optical axis. For instance, the first E×B arrangement 1110 may be arranged above the second E×B arrangement 1120. In yet further alternative embodiments, the first electric field and the first magnetic field, each having two spatial components, may be generated at different positions along the optical axis 490, or even each individual field component may be generated at different positions along the optical axis 490, i.e., a first electric field component, a second electric field component perpendicular to the first electric field component, a first magnetic field component, and a second magnetic field component perpendicular to the first magnetic field component may be generated at different positions along the optical axis 490.

Figure 12:
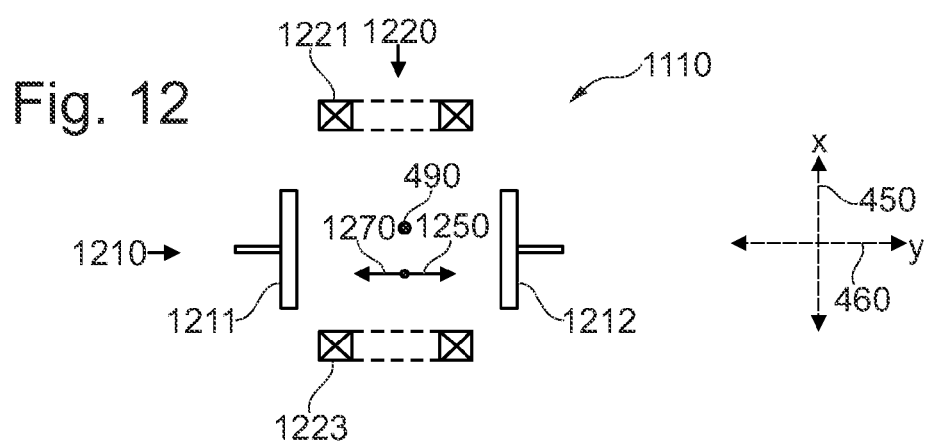
FIG. 12 provides a top view of a first E×B arrangement according to embodiments described herein.

FIG. 12 provides a top view of the first E×B arrangement 1110 according to one example. The first E×B arrangement 1110 includes a first electrostatic beam separation portion 1210 including two electrode plates 1211 and 1212 arranged parallel to each other on opposite sides of the optical axis 490. The electrode plates 1211 and 1212 are arranged perpendicularly to the drawing plane. The electrode plates 1211 and 1212 are adapted for generating a first electric field component along the y-direction 460. The first E×B arrangement 1110 further includes a first magnetic beam separation portion 1220. The first magnetic beam separation portion 1220 includes electromagnets in the form of coils 1221 and 1223 arranged parallel to each other. The coils 1221 and 1223 are arranged perpendicularly to the drawing plane. The coils 1221 and 1223 are adapted for generating a first magnetic field component along the x-direction 450. If a charged particle beam, for example the primary charged particle beam or the secondary charged particle beam, enters the first E×B arrangement 1110 along the optical axis 490, then this charged particle beam is influenced by the first electric field component and by the first magnetic field component generated by first E×B arrangement 1110. Accordingly, an electromagnetic force would act on the charged particle beam along the y-direction, wherein the electromagnetic force may, e.g., include a first electric force 1260 generated by the first electric field component and a magnetic force 1270 generated by the first magnetic field component. The first electric force 1260 and the first magnetic force 1270 may have opposite orientations, as indicated in FIG. 12, or may have the same orientation, depending on the charge and the travel direction of the charged particle beam. By suitably adjusting the first electric field component and the first magnetic field component generated by first E×B arrangement 1110, the electromagnetic force along the y-direction can be adjusted.

Figure 13:
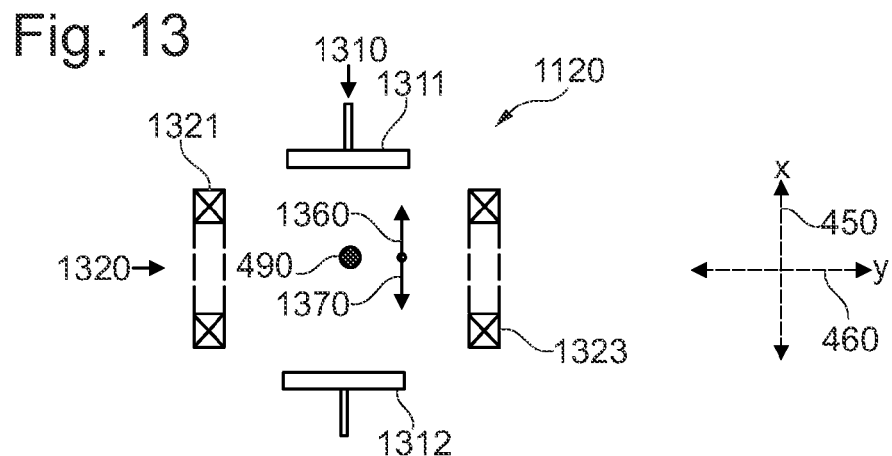
FIG. 13 provides a top view of a second E×B arrangement according to embodiments described herein.

FIG. 13 provides a top view of the second E×B arrangement 1120 according to an example. The second E×B arrangement 1120 includes a second electrostatic beam separation portion 1310 including two electrode plates 1311 and 1312. The electrode plates 1311 and 1312 are adapted for generating a second electric field component along the x-direction 450. The second E×B arrangement 1120 further includes a second magnetic beam separation portion 1320 including electromagnets 1321 and 1323 in the form of coils. The electromagnets 1321 and 1323 are adapted for generating a second magnetic field component along the y-direction 460. If a charged particle beam, for example the primary charged particle beam or the secondary charged particle beam, enters the second E×B arrangement 1120 along the optical axis 490, then the charged particle beam is influenced by the second electric field component and by the second magnetic field component generated by the second E×B arrangement 1120. Accordingly, an electromagnetic force would act on the charged particle beam along the x-direction, wherein the electromagnetic force may include an second electric force 1360 generated by the second electric field component and a second magnetic force 1370 generated by the second magnetic field component. The second electric force 1360 and the second magnetic force may have opposite orientations, as indicated in FIG. 13, or may have the same orientation, depending on the charge and the travel direction of the charged particle beam. By suitably adjusting the second electric field component and the second magnetic field component generated by the second E×B arrangement 1120, the electromagnetic force along the x-direction can be adjusted.

The electric field generated by the beam separation unit 230 is a superposition of the first electric field component generated by the first E×B arrangement 1110 along the y-direction 460 and of the second electric field component generated by the second E×B arrangement 1120 along the x-direction 450. The magnetic field generated by the beam separation unit 230 is a superposition of the first magnetic field component generated by the first E×B arrangement 1110 along the x-direction 450 and of the second magnetic field component generated by the second E×B arrangement 1120 along the y-direction 460. The first E×B arrangement 1110 and the second E×B arrangement 1120 thus allow adjusting two spatial components of the electric field generated by the beam separation unit 230 and adjusting two spatial components of the magnetic field generated by the beam separation unit 230. If the primary charged particle beam travels through the beam separation unit 230 in one direction and the secondary charged particle beam travels through the beam separation unit 230 in the opposite direction then the beam separation unit 230 allows adjusting the electromagnetic force acting on the charged particle beams in the x-direction 450 and the electromagnetic force acting on the charged particle beams in the y-direction 460. There are enough degrees of freedom for adjusting said fields and the resulting forces so that a specific path of the primary charged particle beam can be maintained while the secondary charged particle beam can be separated from the primary charged particle beam and can be made to travel along different secondary charged particle beam paths, e.g., towards optical components and/or detectors of the detector dome of the charged particle beam device. The secondary charged particle beam paths may be made to follow any direction when viewed in a projection into the x-y-plane. In other words, the secondary charged particle beam may be swirled by 360° when viewed in a projection into the x-y-plane.

According to some embodiments, which can be combined with other embodiments described herein, the beam separation unit is of two-dimensional Wien filter type. The beam separation unit may be adapted for generating an electric field, in particular an adjustable electric field, and/or for generating a magnetic field, in particular an adjustable magnetic field. The beam separation unit may be adapted for generating the first electric field, the first magnetic field, the second electric field, the second magnetic field, the third electric field and the third magnetic field according to embodiments described herein. Each of the first, second and third electric fields may have two spatial components defined with respect to respective reference directions, e.g., an x-component and a y-component.

According to some embodiments, which can be combined with other embodiments described herein, the beam separation unit may include a first electrostatic beam separation portion for adjusting a first spatial component of the electric field generated by the beam separation unit. The first electrostatic beam separation portion may be adapted for adjusting a first spatial component of the first electric field, such as e.g. the x-component 261 of the first electric field 260 shown in FIG. 4, and/or for adjusting a first spatial component of the second electric field, such as e.g. the x-component 361 of the second electric field 360 shown in FIG. 5. The first electrostatic beam separation portion may include electrodes, such as a pair of electrodes, for generating an electric field. The electrodes may include electrode plates arranged in a direction parallel to the optical axis defined by the beam separation unit. The optical axis may extend between the electrodes. The optical axis may be a symmetry axis of the first electrostatic beam separation portion. The first electrostatic beam separation portion may include an electrostatic dipole element, quadrupole element or n-th order multipole element with n≥8, wherein the first electrostatic beam separation portion may be adapted for generating an electrostatic dipole field.

The beam separation unit may further include a second electrostatic beam separation portion for adjusting a second spatial component of the electric field generated by the beam separation unit. The second electrostatic beam separation portion may be adapted for adjusting a second spatial component of the first electric field, such as e.g. y-component 262 of the first electric field 260 shown in FIG. 4, and/or for adjusting a second spatial component of the second electric field, such as e.g. the y-component 362 of the second electric field 360 shown in FIG. 5. The second electrostatic beam separation portion may include electrodes, such as a pair of electrodes, for generating an electric field. The electrodes may include electrode plates arranged in a direction parallel to the optical axis defined by the beam separation unit. The optical axis may extend between the electrodes. The optical axis may be a symmetry axis of the second electrostatic beam separation portion. The second electrostatic beam separation portion may include an electrostatic dipole element, quadrupole element or n-th order multipole element with n≥8, wherein the second electrostatic beam separation portion may be adapted for generating an electrostatic dipole field.

The beam separation unit may further include a first magnetic beam separation portion for adjusting a first spatial component of a magnetic field generated by the beam separation unit. The first magnetic beam separation portion may be adapted for adjusting a first spatial component of the first magnetic field, such as e.g. x-component 271 of the first magnetic field 270 shown in FIG. 4, and/or for adjusting a first spatial component of the second magnetic field, such as e.g. x-component 371 of the second magnetic field 370 shown in FIG. 5. The first magnetic beam separation portion may include an electromagnet. The electromagnet may include one or more coils through which a current may be passed for generating a magnetic field. The first magnetic beam separation portion may include a magnetic dipole element, quadrupole element or n-th order multipole element with n≥8, wherein the first magnetic beam separation portion may be adapted for generating a magnetic dipole field. The optical axis may be a symmetry axis of the first magnetic beam separation portion.

The beam separation unit may further include a second magnetic beam separation portion for adjusting a second spatial component of the magnetic field generated by the beam separation unit. The second magnetic beam separation portion may be adapted for adjusting the second spatial component of the first magnetic field, such as e.g. y-component 272 of the first magnetic field 270 shown in FIG. 4, and/or for adjusting the second spatial component of the second magnetic field, such as e.g. y-component 372 of the second magnetic field 370 shown in FIG. 5. The second magnetic beam separation portion may include an electromagnet. The electromagnet may include one or more coils through which a current may be passed for generating a magnetic field. The second magnetic beam separation portion may include a magnetic dipole element, quadrupole element or n-th order multipole element with n≥8, wherein the second magnetic beam separation portion may be adapted for generating a magnetic dipole field. The optical axis may be a symmetry axis of the second magnetic beam separation portion.

The beam separation unit may include a first E×B arrangement, wherein the first E×B arrangement may include the first magnetic beam separation portion and the first electrostatic beam separation portion. The beam separation unit may include a second E×B arrangement, wherein the second E×B arrangement may include the second magnetic beam separation portion and the second electrostatic beam separation portion. The first E×B arrangement and/or the second E×B arrangement may be of one-dimensional Wien filter type. The optical axis defined by the beam separation unit may coincide with an optical axis defined by the first E×B arrangement and/or may coincide with an optical axis defined by the second E×B arrangement. The optical axis defined by the beam separation unit may be a symmetry axis of the first E×B arrangement and/or a symmetry axis of the second E×B arrangement. The first E×B arrangement and the second E×B arrangement may be arranged at the same position along the optical axis. Alternatively, the first E×B arrangement and the second E×B arrangement may be arranged sequentially along the optical axis. The optical axis may extend vertically with respect to the sample plane, wherein the first E×B arrangement and second E×B arrangement may be arranged along the optical axis. Therein the first E×B arrangement may be arranged above the second E×B arrangement, below the second E×B arrangement or at the same location. The first E×B arrangement may be arranged proximate to the second E×B arrangement, specifically with no other components of the charged particle beam device in between.

A plane containing the optical axis and the extending through the first electrostatic beam separation portion, in particular extending through electrodes included in the first electrostatic beam separation portion, may be perpendicular to a plane containing the optical axis and extending through the second electrostatic beam separation portion, in particular through electrodes included in the second electrostatic beam separation portion. A plane containing the optical axis and the extending through the first magnetic beam separation portion may be perpendicular to a plane containing the optical axis and extending through the second magnetic beam separation portion.

Figure 14:
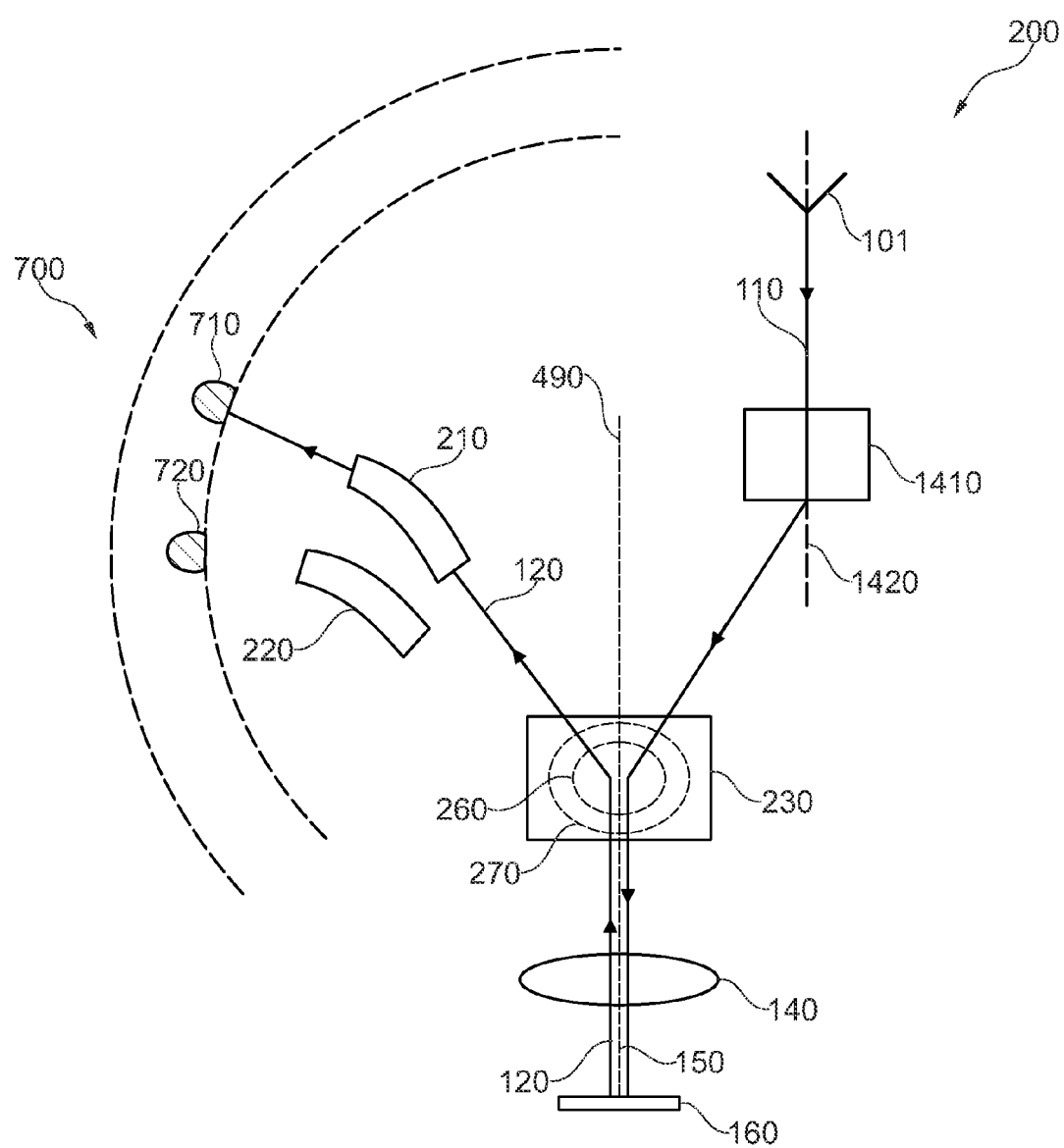
FIG. 14 provides a side view of a charged particle beam device including a dispersion compensation unit according to embodiments described herein.

FIG. 14 shows a side view of an embodiment of a charged particle beam device including a dispersion compensation unit 1410 of two-dimensional Wien filter type. The dispersion compensation unit 1410 is arranged upstream of the beam separation unit 230 in relation to the primary charged particle beam 110. The primary charged particle beam 110 travels through the dispersion compensation unit 1410. The primary charged particle beam 110 beam entering the dispersion compensation unit 1410 travels along an optical axis 1420 defined by the dispersion compensation unit 1410. The optical axis 1420 coincides with the axis along which the beam emitter 101 emits the primary charged particle beam 110. The optical axis 1420 of the dispersion compensation unit 1410 is parallel to the optical axis 490 defined by the beam separation unit. Optical axis 1420 is disposed at an off-set with respect to optical axis 490. The secondary charged particles do not reach the dispersion compensation unit 1410, in other words the dispersion compensation unit is arranged outside a secondary charged particle beam path of the charged particle beam device, such that the dispersion compensation unit influences only the primary charged particle beam but not directly the secondary charged particle beam. The charged particle device shown in FIG. 14 further includes an objective lens 140. An optical axis 150 defined by the objective lens 140 coincides with the optical axis 490 defined by the beam separation unit.

The primary charged particle beam 110 shown in FIG. 14 is deflected in the dispersion compensation unit 1410. An advantage of deflecting the primary charged particle beam in the dispersion compensation unit is that the geometric layout of the primary charged particle beam column can be designed more flexibly. An offset between an optical axis in an upper part of the primary charged particle beam column and an optical axis in a lower part of the primary charged particle beam column can give more space for secondary charged particle beam elements, such as the first optical component, the second optical component, the detector dome, the first detector and/or the second detector according to embodiments described herein.

The deflection of the primary charged particle beam 110 in the dispersion compensation unit 1410 is such that the travel direction of the primary charged particle beam 110 entering the beam separation unit 230 is inclined with respect to the optical axis 490. The primary charged particle beam 110 travels straight from the dispersion compensation unit 1410 to the beam separation unit 230, i.e. without changing its direction between the dispersion compensation unit 1410 and the beam separation unit 230. As shown in FIG. 14, the primary charged particle beam 110 propagates along parallel optical axes 1420 and 490, except in the region between the dispersion compensation unit 1410 and the beam separation unit 230.

The beam separation unit 230 may introduce dispersion in the primary charged particle beam. Dispersion may result when primary charged particles have different individual energies or momenta, and so they are not experiencing the same deflection in the beam separation unit. The dispersion compensation unit 1410 shown in FIG. 14 may have an adjustable dispersion to compensate the dispersion introduced by the beam separation unit 230. An advantage of compensating the dispersion introduced by the beam separation unit is that small charged particle probes with high current density may thus be generated. Further, the dispersion compensation unit 1410 may be adapted for adjusting the dispersion independently of the path of the primary beam, e.g., independently of an inclination angle of the primary charged particle beam upstream and/or downstream of the dispersion compensation unit, and independently of an inclination angle of the primary charged particle beam upstream and/or downstream of the beam separation unit.

The dispersion compensation unit 1410 shown in FIG. 14 is of two-dimensional Wien filter type. Accordingly, the dispersion compensation unit 1410 may be adapted to generate an electrostatic dispersion compensation field and a magnetic dispersion compensation field in any direction in a plane orthogonal to the optical axis 1420. The electrostatic dispersion compensation field and the magnetic dispersion compensation field may each have an x-component and a y-component. The dispersion introduced by the electric field and by the magnetic field generated by the beam separation unit, wherein the electric field and the magnetic field each have an x-component and a y-component as well as discussed above, may be compensated by suitably adjusting the x-component and the y-component of the electrostatic dispersion compensation field and of the magnetic dispersion compensation field.

The terminology "electrostatic dispersion compensation field", used herein for the sake of convenience, is not intended to imply that the electrostatic dispersion compensation field alone should be adapted to fully compensate the dispersion of the beam separation unit. As described above, the dispersion may be compensated by the joint influence of the electrostatic dispersion compensation field and the magnetic dispersion compensation field. Similar considerations apply to the terminology "magnetic dispersion compensation field" as used herein.

According to some embodiments, which can be combined with other embodiments described herein, the charged particle beam device includes a dispersion compensation unit, such as e.g. dispersion compensation unit 1410 shown in FIG. 14. The dispersion compensation unit may be arranged upstream of the beam separation unit in relation to the primary charged particle beam. The dispersion compensation unit may have an adjustable dispersion for compensating a dispersion of the beam separation unit.

The primary charged particle beam may enter the dispersion compensation unit parallel to the optical axis of the beam separation unit. The dispersion compensation unit may be adapted for deflecting the primary charged particle beam. Alternatively, the primary charged particle beam may pass through the dispersion compensation unit without changing its direction. The dispersion of the dispersion compensation unit may be adjustable independently of the amount of deflection of the primary charged particle beam in the dispersion compensation unit.

The dispersion compensation unit may define an optical axis, such as e.g. optical axis 1420 shown in FIG. 14. The optical axis defined by the dispersion compensation unit may be parallel to the optical axis defined by the beam separation unit. Alternatively, the optical axis defined by the dispersion compensation unit may be tilted with respect to the optical axis defined by the beam separation unit. The optical axis defined by the dispersion compensation unit may be disposed at an off-set with respect to the optical axis defined by the beam separation unit. The off-set may lie in the range from 1 to 15 mm. Alternatively, the optical axis defined by the dispersion compensation unit may coincide with the optical axis defined by the beam separation unit. Accordingly, the primary charged particle beam may travel from the beam emitter to the beam separation unit via the dispersion compensation unit along a straight path.

According to some embodiments, which can be combined with other embodiments described herein, the dispersion compensation unit is of two-dimensional Wien filter type. The dispersion compensation unit may be adapted for generating an electrostatic dispersion compensation field, in particular an adjustable electrostatic dispersion compensation field, for compensating the dispersion of the beam separation unit. The dispersion compensation unit may be adapted for generating a magnetic dispersion compensation field, in particular an adjustable magnetic dispersion compensation field, for compensating the dispersion of the beam separation unit. The electric dispersion compensation field and/or the magnetic dispersion compensation field may be adapted to influence the primary charged particle beam, in particular by introducing a particular amount of dispersion to compensate the dispersion of the beam separation unit.

According to some embodiments, which can be combined with other embodiments described herein, the dispersion compensation unit may include a first electrostatic dispersion compensation portion for adjusting a first spatial component of the electrostatic dispersion compensation field. The first spatial component of the electrostatic dispersion compensation field may e.g. be an x-component of the electrostatic dispersion compensation field defined with respect to the x-direction 450. The first electrostatic dispersion compensation portion may include electrodes, such as a pair of electrodes, for generating an electric field. The first electrostatic dispersion compensation portion may include an electrostatic dipole element, quadrupole element or n-th order multipole element with n≥8, wherein the first electrostatic dispersion compensation portion may be adapted for generating an electrostatic dipole field.

The dispersion compensation unit may further include a second electrostatic dispersion compensation portion for adjusting a second spatial component of the electric dispersion compensation field. The second spatial component of the electrostatic dispersion compensation field may e.g. be a y-component of the electrostatic dispersion compensation field defined with respect to the y-direction 460. The second electrostatic dispersion compensation portion may include electrodes, such as a pair of electrodes, for generating an electric field. The second electrostatic dispersion compensation portion may include an electrostatic dipole element, quadrupole element or n-th order multipole element with n≥8, wherein the second electrostatic dispersion compensation portion may be adapted for generating an electrostatic dipole field.

The dispersion compensation unit may further include a first magnetic dispersion compensation portion for adjusting a first spatial component of the magnetic dispersion compensation field. The first spatial component of the magnetic dispersion compensation field may e.g. be an x-component of the magnetic dispersion compensation field defined with respect to the x-direction 450. The first magnetic dispersion compensation portion may include an electromagnet. The electromagnet may include a coil through which a current may be passed for generating a magnetic field. The first magnetic dispersion compensation portion may include a magnetic dipole element, quadrupole element or n-th order multipole element with n≥8, wherein the first magnetic dispersion compensation portion may be adapted for generating a magnetic dipole field.

The dispersion compensation unit may further include a second magnetic dispersion compensation portion for adjusting a second spatial component of the magnetic dispersion compensation field. The second spatial component of the magnetic dispersion compensation field may e.g. be a y-component of the magnetic dispersion compensation field defined with respect to the y-direction 460. The second magnetic dispersion compensation portion may include an electromagnet. The electromagnet may include a coil through which a current may be passed for generating a magnetic field. The second magnetic dispersion compensation portion may include a magnetic dipole element, quadrupole element or n-th order multipole element with n≥8, wherein the second magnetic dispersion compensation portion may be adapted for generating a magnetic dipole field.

The dispersion compensation unit may include a first dispersion compensation E×B arrangement, wherein the first dispersion compensation E×B arrangement may include the first magnetic dispersion compensation portion and the first electrostatic dispersion compensation portion. The dispersion compensation unit may include a second dispersion compensation E×B arrangement, wherein the second dispersion compensation E×B arrangement may include the second magnetic dispersion compensation portion and the second electrostatic dispersion compensation portion. The first dispersion compensation E×B arrangement and/or the second dispersion compensation E×B arrangement may be of one-dimensional Wien filter type.

According to some embodiments, which can be combined with other embodiments, the method described herein may further include compensating, by the dispersion compensation unit, the dispersion which the beam separation unit introduces into the primary charged particle beam. The dispersion introduced by the beam separation unit may be compensated by the dispersion compensation unit to reduce, at least, first-order beam broadening caused by the energy width of the primary charged particle beam.

Compensating the dispersion introduced by the beam separation unit may include adjusting the dispersion of the dispersion compensation unit. Compensating the dispersion introduced by the beam separation unit may include generating the electrostatic dispersion compensation field and/or the magnetic dispersion compensation field. Compensating the dispersion introduced by the beam separation unit may include at least one of: adjusting the first spatial component of the electrostatic dispersion compensation field, wherein the first spatial component of the electrostatic dispersion compensation field may be adjusted by the first electrostatic dispersion compensation portion; adjusting the second spatial component of the electrostatic dispersion compensation field, wherein the second spatial component of the electrostatic dispersion compensation field may be adjusted by the second electrostatic dispersion compensation portion; adjusting the first spatial component of the magnetic dispersion compensation field, wherein the first spatial component of the magnetic dispersion compensation field may be adjusted by the first magnetic dispersion compensation portion; adjusting the second spatial component of the magnetic dispersion compensation field, wherein the second spatial component of the magnetic dispersion compensation field may be adjusted by the second magnetic dispersion compensation portion.

According to some embodiments, which can be combined with other embodiments described herein, the charged particle beam device may include a control unit. The control unit may be configured for calculating data, wherein the data may include a magnitude and/or a direction of a target electric field and/or of a target magnetic field. The control unit may further be configured for providing the calculated data to the beam separation unit. The beam separation unit may be configured for generating the target electric field and the target magnetic field in response to receiving the calculated data from the control unit.

The target electric field may be the first electric field, the second electric field or any other electric field configuration generated in the beam separation unit as described herein. The target magnetic field may be the first magnetic field, the second magnetic field or any other magnetic field configuration generated in the beam separation unit as described herein.

For example, if the target electric field is the first electric field and if the target magnetic field is the first magnetic field, the data calculated by the control unit may be calculated from a direction along which the first target axis is oriented and from the relative position of the first optical component with respect to the beam separation unit. In other words, the magnitude and the direction of the first electric field and the first magnetic field are calculated based on the directions in which the primary charged particle beam and the secondary charged particle beam are to be deflected in the beam separation unit under the influence of the first electric field and the first magnetic field. As another example, if the target electric field is the second electric field and if the target magnetic field is the second magnetic field, the data calculated by the control unit may be calculated from a direction along which the first target axis is oriented and from the relative position of the second optical component with respect to the beam separation unit.

According to embodiments, the data calculated by the control unit may be calculated from at least one of the following: a direction along which the first target axis is oriented; the relative position of the first optical component with respect to the beam separation unit, in particular the first distance and/or the azimuthal angle between the first plane and the zero plane; the relative position of the second optical component with respect to the beam separation unit, in particular the second distance and/or the azimuthal angle between the second plane and the zero plane; the relative position of the first detector with respect to the beam separation unit, in particular the first polar angle and/or the azimuthal angle between the first plane and the zero plane; the relative position of the second detector with respect to the beam separation unit, in particular the second polar angle and/or the azimuthal angle between the second plane and the zero plane.

The control unit may be configured for calculating further data from the calculated data. The further data may include a magnitude and/or a direction of a target electrostatic dispersion compensation field and of a target magnetic dispersion compensation field.

The control unit may be configured for providing the further calculated data to the dispersion compensation unit. The dispersion compensation unit may be configured to generate the target electrostatic dispersion compensation field and/or the target magnetic dispersion compensation field in response to receiving the further calculated data. The target electrostatic dispersion compensation field and/or the target magnetic dispersion compensation field may be adapted for compensating a dispersion introduced into the primary charged particle beam by beam separation unit in which the target electric field and the target magnetic field are generated.

The method may further include deflecting the primary charged particle beam in the dispersion compensation unit. The deflection may include electrostatic deflection and/or magnetic deflection. The primary charged particle beam may be deflected in the dispersion compensation unit by the first electrostatic dispersion compensation portion, the second electrostatic dispersion compensation portion, the first magnetic dispersion compensation portion and/or the second magnetic dispersion compensation portion.

According to some embodiments, which can be combined with other embodiments described herein, the charged particle beam device includes a third optical component.

The third optical component may be distanced from the sample plane by a third distance in the direction perpendicular to the sample plane. The third optical component may be arranged at the same side of the sample plane as the second optical component and/or at the same side of the sample plane as the first optical component. The third distance may be a vertical distance. The third distance may be a third height above the sample or sample plane. The third optical component may be arranged in a fixed position in the charged particle beam device. The relative position of the third optical component with respect to the beam separation unit may be fixed.

According to some embodiments, which can be combined with other embodiments described herein, the third optical component is a beam bender for bending the secondary charged particle beam. According to other embodiments, the third optical component is a secondary particle optics or part of a secondary charged particle optics, e.g. a lens or aperture. According to still other embodiments, the third optical component may be a detector for detecting the secondary charged particle beam. In particular, the third optical component may be a third detector included in the detector dome.

The secondary charged particle beam may travel from the beam separation unit to the third optical component along a third optical path. The third optical component may be arranged directly downstream of the beam separation unit with respect to the third optical path, for example if the third optical component is a beam bender. The third optical component may be the next optical element influencing the secondary charged particle beam along the third optical path. Alternatively, the third optical component may not be disposed directly downstream along the third optical path, for example if the third optical component is (part of) a secondary particle optics or a detector. There may be another optical element, for example a beam bender, influencing the secondary charged particle beam on the third optical path between the beam separation unit and the third optical component, before the secondary charged particle beam reaches the third optical component.

An azimuthal angle may exist between the second plane and a third plane, wherein the third plane contains the optical axis defined by the beam separation unit and wherein the third plane may extend through the third optical component. The third plane may in particular extend through a central portion of the third optical component. The third optical component may be distanced from the second plane. The second optical component may be distanced from the third plane. The third plane may be different from the second plane. The azimuthal angle between the third plane and the second plane may lie in the range from 5 to 145 degrees, more particularly from 10 to 100 degrees, still more particularly from 25 to 60 degrees.

According to embodiments, which can be combined with other embodiments described herein, an azimuthal angle may exist between the first plane and the third plane. The third plane may be different from the first plane. The third optical component may be distanced from the first plane. The first optical component may be distanced from the third plane. The azimuthal angle between the third plane and the second plane may lie in the range from 5 to 145 degrees, more particularly from 10 to 100 degrees, still more particularly from 25 to 60 degrees.

According to embodiments, which can be combined with embodiments described herein, the second plane may coincide with the third plane. The second distance may be different from the third distance, in particular if the second plane coincides with the third plane. According to other embodiments, which can be combined with other embodiments described herein, the second distance may be the same as the third distance, in particular if an azimuthal angle may exist between the second plane and the third plane.

According to some embodiments, which can be combined with other embodiments described herein, the secondary charged particle detectors of the detector dome include a third detector distanced from the first detector and distanced from the second detector. The third detector may be arranged downstream, with respect to the third optical path of the secondary charged particle beam, of the beam separation unit.

The third detector may be distanced from the beam emitter. The third detector may be arranged above an objective lens included in the charged particle beam device. The third detector may be arranged opposite of a sample side of the objective lens.

An azimuthal angle may exist between the second plane and the third plane, wherein the third plane contains the optical axis defined by the beam separation unit and wherein the third plane may extend through the third detector. The third plane may in particular extend through a central portion of the third detector. The third detector may be distanced from the second plane and/or from the first plane.

According to some embodiments, which can be combined with other embodiments described herein, a third polar angle exists between the optical axis defined by the beam separation unit and a third reference axis, the third reference axis being contained in the third plane and extending through the beam separation unit and through the third detector. The third polar angle may lie in the range from 0 to 45 degrees, more particularly from 0 to 30 degrees, still more particularly from 0 to 20 degrees.

According to embodiments, which can be combined with embodiments described herein, the second plane may coincide with the third plane. The second polar angle may be different from the third polar angle, in particular if the second plane coincides with the third plane. The difference between the second polar angle and the third polar angle may lie in the range from 0 to 45 degrees, more particularly from 0 to 30 degrees, still more particularly from 0 to 20 degrees. According to other embodiments, which can be combined with embodiments described herein, the second polar angle may be the same as the third polar angle, specifically if an azimuthal angle exists between the second plane and the third plane. A magnitude of the second polar angle may be the same as a magnitude of the third polar angle and/or an orientation of the second polar angle may be the same as an orientation of the third polar angle.

Embodiments of the method described herein may further include: generating a third electric field and a third magnetic field in the beam separation unit; guiding the primary charged particle beam through the beam separation unit in which the third electric field and the third magnetic field are generated, wherein the travel direction of the primary charged particle beam leaving the beam separation unit is aligned with the first target axis under the influence of the third electric field and the third magnetic field; and separating the secondary charged particle beam from the primary charged particle beam in the beam separation unit, wherein the secondary charged particle beam is deflected under the influence of the third electric field and the third magnetic field to travel from the beam separation unit to the third optical component.

A direction in which the third electric field is generated and/or a direction in which the third magnetic field is generated may be perpendicular or substantially perpendicular to the optical axis defined by the beam separation unit. The third electric field may be a homogeneous third electric field, at least in the region where the primary charged particle beam and/or secondary charged particle beam pass through the third electric field. The third magnetic field may be a homogeneous third magnetic field. The third electric field may be perpendicular or substantially perpendicular to the third magnetic field. Here, the term "substantially perpendicular" means a tolerance of less than or equal to ±10°, in particular less than or equal to ±5°.

The third electric field may be different from the first electric field and/or the second electric field. More specifically, a magnitude of the third electric field may be different from a magnitude of the first electric field and/or from a magnitude of the second electric field. Alternatively or in addition, the direction in which the second electric field is generated may be different from the direction in which the first electric field is generated and/or from the direction in which the second electric field is generated.

The third magnetic field may be different from the first magnetic field and/or from the second magnetic field. More specifically, a magnitude of the third magnetic field may be different from a magnitude of the first magnetic field and/or from a magnitude of the second magnetic field. Alternatively or in addition, the direction in which the third magnetic field is generated may be different from the direction in which the first magnetic field is generated and/or from the direction in which the second magnetic field is generated.

The travel direction of the primary charged particle beam leaving the beam separation unit in which the third electric field and the third magnetic field are applied may be determined by and/or be dependent on the third electric field and/or the third magnetic field. The travel direction of the secondary charged particle beam leaving the beam separation unit may be determined by and/or be dependent on the third electric field and/or third magnetic field. The travel direction of the secondary charged particle beam leaving the beam separation unit may be different from the travel direction of the secondary charged particle beam entering the beam separation unit. The travel direction of the secondary charged particle beam leaving the beam separation unit in which the third electric field and the third magnetic field are generated may be different from the travel direction of the secondary charged particle beam leaving the beam separation unit in which the first electric field and the first magnetic field are generated and/or different from the travel direction of the secondary charged particle beam leaving the beam separation unit in which the second electric field and the second magnetic field are generated.

The third electric field may have two adjustable degrees of freedom, in particular two adjustable spatial components. The third electric field may have a spatial component, in particular an adjustable spatial component, defined with respect to the first reference direction. The first reference direction may e.g. be the x-direction 450 as described herein. The third electric field may have a spatial component, in particular an adjustable spatial component, defined with respect to the second reference direction. The second reference direction may e.g. be the y-direction 460 as described herein. The third magnetic field may have two adjustable degrees of freedom, in particular two adjustable spatial components. The third magnetic field may have a spatial component, in particular an adjustable spatial component, defined with respect to the third reference direction. The third reference direction may e.g. be the x-direction 450 as described herein. The third magnetic field may have a spatial component, in particular an adjustable spatial component, defined with respect to the fourth reference direction. The fourth reference direction may e.g. be the y-direction 460 as described herein.

According to some embodiments, which can be combined with other embodiments described herein, the third electric field may be generated in dependence of the relative position of the third optical component with respect to the beam separation unit, in dependence of the third polar angle and/or in dependence of an azimuthal angle between the third plane and the zero plane. As described above, the zero plane may e.g. be the zero plane 440 shown in FIGS. 4-5. The third magnetic field may be generated in dependence of the relative position of the third optical component with respect to the beam separation unit, in dependence of the third polar angle and/or in dependence of the azimuthal angle between the third plane and the zero plane containing the optical axis defined by the beam separation unit.

The method may further include guiding the secondary charged particle beam from the third optical component to the third detector included in the secondary charged particle detectors of the detector dome. The method may further include detecting the secondary charged particle beam with the third detector. The secondary charged particle beam may be detected by the third detector at the detection side of the detector dome. The first detector, the second detector and/or the third detector may be arranged at equal distances from the beam separation unit.

According to a further embodiment, a charged particle beam device is provided. The charged particle beam device includes a beam emitter, a beam separation unit and a detector dome as described herein. The detector dome includes secondary charged particle detectors which include a first detector and a second detector as described herein. The detector dome may further include a third detector as described herein. The charged particle beam device may further include a dispersion compensation unit, a first optical component, a second optical component and/or a third optical component as described herein.

According to a further embodiment, a further charged particle beam device is provided. The charged particle beam device includes a beam emitter, a beam separation unit, a first optical component and a second optical component as described herein. The charged particle beam device may further include a detector dome as described herein. The charged particle beam device may further include a dispersion compensation unit and/or a third optical component as described herein.

Figure 16:
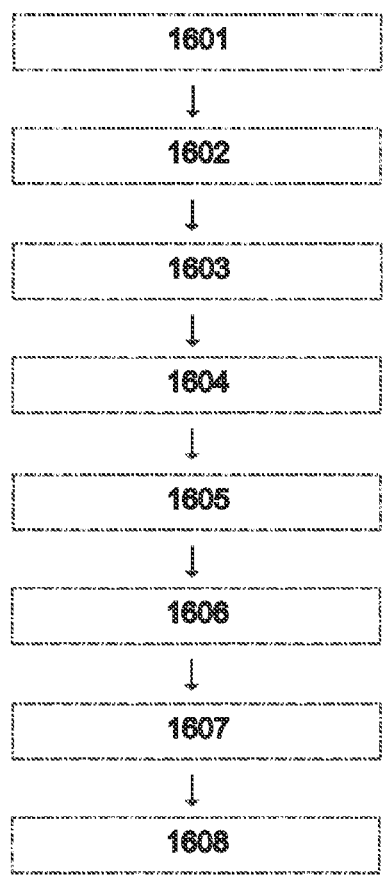
FIGS. 16-17 provide flow diagrams illustrating methods for operating a charged particle beam device according to embodiments described herein.
Figure 17:
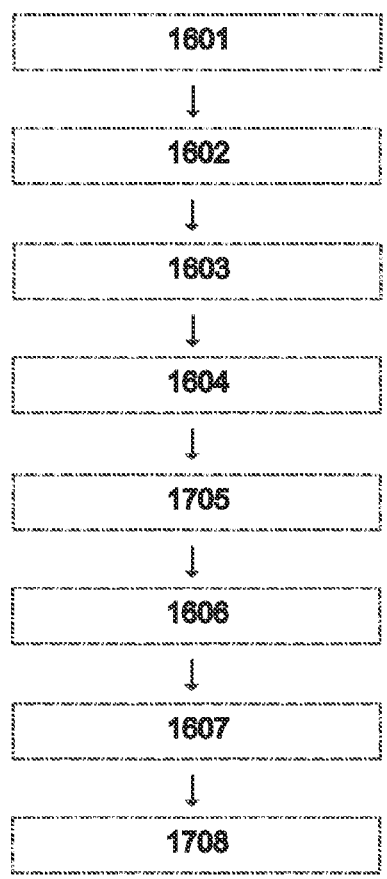

FIGS. 16 and 17 illustrate methods of operating a charged particle beam device according to embodiments. The charged particle beam device includes a beam separation unit. The charged particle beam device may further include a first optical component and a second optical component.

In FIG. 16, reference numeral 1601 illustrates generating a primary charged particle beam. Reference numeral 1602 illustrates generating a first electric field and a first magnetic field in the beam separation unit. Reference numeral 1603 illustrates guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field. Reference numeral 1604 illustrates generating a secondary charged particle beam by impingement of the primary charged particle beam onto a sample. Reference numeral 1605 illustrates separating the secondary charged particle beam from the primary charged particle beam in the beam separation unit, wherein the secondary charged particle beam is deflected under the influence of the first electric field and the first magnetic field to travel from the beam separation unit to the first optical component. Reference numeral 1606 illustrates generating a second electric field and a second magnetic field in the beam separation unit. Reference numeral 1607 illustrates guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field. Reference numeral 1608 illustrates separating the secondary charged particle beam from the primary charged particle beam in the beam separation unit, wherein the secondary charged particle beam is deflected under the influence of the second electric field and the second magnetic field to travel from the beam separation unit to the second optical component.

In FIG. 17, reference numeral 1705 illustrates deflecting the secondary charged particle beam in the beam separation unit to separate the secondary charged particle beam from the primary charged particle beam, wherein a travel direction of the secondary charged particle beam leaving the beam separation unit is aligned with a second target axis under the influence of the first electric field and the first magnetic field. Reference numeral 1708 illustrates deflecting the secondary charged particle beam in the beam separation unit to separate the secondary charged particle beam from the primary charged particle beam, wherein the travel direction of the secondary charged particle beam leaving the beam separation unit is aligned with a third target axis under the influence of the second electric field and the second magnetic field, wherein the third target axis is different from the second target axis.

In view of the foregoing, embodiments described herein allow aligning the secondary charged particle beam leaving the beam separation unit with a target axis at any azimuthal angle and any polar angle without affecting the deflection angle of the primary charged particle beam. The detector dome can thus use the whole 3-dimensional space above the sample and/or objective lens for detecting the secondary charged particle beam. Accordingly, an improved detection of the secondary charged particle beam is provided, wherein multiple detectors included in the detector dome may be used for detecting multiple properties of the secondary charged particle beam, and wherein sufficient space is provided for arranging the multiple detectors in the device. In addition, dispersion introduced into the primary charged particle beam by the beam separation unit may be compensated by the beam separation unit. In particular, dispersion introduced by a beam separation unit of two-dimensional Wien filter type may be compensated by a dispersion compensation unit of two-dimensional Wien filter type.

While the foregoing is directed to some embodiments of the invention, other and further embodiments may be devised without departing from the scope determined by the claims that follow.

The invention claimed is:

1. Method of operating a charged particle beam device including a beam separation unit, a first optical component distanced from the beam separation unit and a second optical component distanced from the beam separation unit and distanced from the first optical component, the method comprising:
generating a primary charged particle beam;
generating a first electric field and a first magnetic field in the beam separation unit;
guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field;
generating a secondary charged particle beam by impingement of the primary charged particle beam onto a sample;
separating the secondary charged particle beam from the primary charged particle beam in the beam separation unit, wherein the secondary charged particle beam is deflected under the influence of the first electric field and the first magnetic field to travel from the beam separation unit to the first optical component;
generating a second electric field and a second magnetic field in the beam separation unit;
guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field; and
separating the secondary charged particle beam from the primary charged particle beam in the beam separation unit, wherein the secondary charged particle beam is deflected under the influence of the second electric field and the second magnetic field to travel from the beam separation unit to the second optical component.

2. Method according to claim 1, wherein the beam separation unit defines an optical axis and wherein an azimuthal angle exists between a first plane and a second plane, the first plane containing the optical axis and extending through the first optical component and the second plane containing the optical axis and extending through the second optical component.

3. Method according to claim 1, wherein the first optical component is distanced from a sample plane by a first distance in a direction perpendicular to the sample plane, and wherein the second optical component is distanced from the sample plane by a second distance in a direction perpendicular to the sample plane, wherein the second distance is different from the first distance.

4. Method according to claim 1, wherein the first optical component is at least one of:
a beam bender for bending the secondary charged particle beam;
secondary particle optics; and
a detector;
and wherein the second optical component is at least one of:
a beam bender for bending the secondary charged particle beam;
secondary particle optics; and
a detector.

5. Method according to claim 1, wherein the charged particle beam device includes a detector dome including secondary charged particle detectors, the secondary charged particle detectors including a first detector and a second detector distanced from the first detector, the method further comprising:
guiding the secondary charged particle beam from the first optical component to the first detector and detecting the secondary charged particle beam with the first detector; and
guiding the secondary charged particle beam from the second optical component to the second detector and detecting the secondary charged particle beam with the second detector.

6. Method according to claim 1, wherein the first target axis coincides with an optical axis defined by the beam separation unit and wherein the primary charged particle beam travels along the optical axis upon leaving the beam separation unit.

7. Method according to claim 1, wherein at least one of the following holds:
the first electric field and the first magnetic field are generated in dependence of a relative position of the first optical component with respect to the beam separation unit; and
the second electric field and the second magnetic field are generated in dependence of a relative position of the second optical component with respect to the beam separation unit.

8. Method according to claim 2, wherein the charged particle beam device includes a third optical component, wherein the first optical component is distanced from a sample plane by a first distance in a direction perpendicular to the sample plane, the second optical component is distanced from the sample plane by a second distance in a direction perpendicular to the sample plane, and the third optical component is distanced from the sample plane by a third distance in a direction perpendicular to the sample plane, the method further comprising:
generating a third electric field and a third magnetic field in the beam separation unit;
guiding the primary charged particle beam through the beam separation unit in which the third electric field and the third magnetic field are generated, wherein the travel direction of the primary charged particle beam leaving the beam separation unit is aligned with the first target axis under the influence of the third electric field and the third magnetic field; and
separating the secondary charged particle beam from the primary charged particle beam in the beam separation unit, wherein the secondary charged particle beam is deflected under the influence of the third electric field and the third magnetic field to travel from the beam separation unit to the third optical component,
wherein either an azimuthal angle exists between the second plane and a third plane, the third plane containing the optical axis and extending through the third optical component, or the second plane and the third plane coincide and the second distance is different from the third distance.

9. Method according to claim 8, wherein the charged particle beam device includes a detector dome including secondary charged particle detectors, the secondary charged particle detectors including a first detector, a second detector distanced from the first detector, and a third detector distanced from the first detector and distanced from the second detector, the method further comprising:
guiding the secondary charged particle beam from the first optical component to the first detector and detecting the secondary charged particle beam with the first detector;
guiding the secondary charged particle beam from the second optical component to the second detector and detecting the secondary charged particle beam with the second detector; and
guiding the secondary charged particle beam from the third optical component to the third detector and detecting the secondary charged particle beam with the third detector.

10. The method according to claim 1, wherein the charged particle beam device includes a dispersion compensation unit of two-dimensional Wien filter type arranged, in relation to the primary charged particle beam, upstream of the beam separation unit, the method further comprising:
compensating, by the dispersion compensation unit, a dispersion which the beam separation unit introduces into the primary charged particle beam.

11. Method of operating a charged particle beam device including a beam separation unit, the method comprising:
generating a primary charged particle beam;
generating a first magnetic field and a first electric field in the beam separation unit;
guiding the primary charged particle beam through the beam separation unit in which the first electric field and the first magnetic field are generated, wherein a travel direction of the primary charged particle beam leaving the beam separation unit is aligned with a first target axis under the influence of the first electric field and the first magnetic field;
generating a secondary charged particle beam by impingement of the primary charged particle beam onto a sample;
deflecting the secondary charged particle beam in the beam separation unit to separate the secondary charged particle beam from the primary charged particle beam, wherein a travel direction of the secondary charged particle beam leaving the beam separation unit is aligned with a second target axis under the influence of the first electric field and the first magnetic field;
generating a second magnetic field and a second electric field in the beam separation unit;
guiding the primary charged particle beam through the beam separation unit in which the second electric field and the second magnetic field are generated, wherein the travel direction of the primary charged particle beam leaving the beam separation unit is aligned with the first target axis under the influence of the second electric field and the second magnetic field; and
deflecting the secondary charged particle beam in the beam separation unit to separate the secondary charged particle beam from the primary charged particle beam, wherein the travel direction of the secondary charged particle beam leaving the beam separation unit is aligned with a third target axis under the influence of the second electric field and the second magnetic field, wherein the third target axis is different from the second target axis.

12. A charged particle beam device comprising:
a beam emitter for emitting a primary charged particle beam;
a beam separation unit for separating the primary charged particle beam from a secondary charged particle beam generated upon impingement of the primary charged particle beam onto a sample, the beam separation unit defining an optical axis;
a detector dome comprising secondary charged particle detectors, the secondary charged particle detectors comprising a first detector and a second detector, wherein:
the first detector is arranged downstream, with respect to a first optical path of the secondary charged particle beam, of the beam separation unit; and
the second detector is arranged downstream, with respect to a second optical path of the secondary charged particle beam, of the beam separation unit,
wherein an azimuthal angle exists between a first plane and a second plane, the first plane containing the optical axis and extending through the first detector and the second plane containing the optical axis and extending through the second detector.

13. The charged particle beam device according to claim 12, wherein:
- a first polar angle exists between the optical axis defined by the beam separation unit and a first reference axis, the first reference axis being contained in the first plane and extending through the beam separation unit and through the first detector; and
- a second polar angle exists between the optical axis defined by the beam separation unit and a second reference axis, the second reference axis being contained in the second plane and extending through the beam separation unit and through the second detector, wherein the second polar angle is the same as the first polar angle.

14. The charged particle beam device according to claim 12, wherein the beam separation unit is of two-dimensional Wien filter type and comprises:
- a first magnetic beam separation portion for adjusting a first spatial component of a magnetic field generated by the beam separation unit;
- a second magnetic beam separation portion for adjusting a second spatial component of the magnetic field generated by the beam separation unit;
- a first electrostatic beam separation portion for adjusting a first spatial component of an electric field generated by the beam separation unit; and
- a second electrostatic beam separation portion for adjusting a second spatial component of the electric field generated by the beam separation unit.

15. The charged particle beam device according to claim 12, further comprising:
- a first optical component arranged, with respect to the first optical path of the secondary charged particle beam, downstream of the beam separation unit and upstream of the first detector; and
- a second optical component arranged, with respect to the second optical path of the secondary charged particle beam, downstream of the beam separation unit and upstream of the second detector.

16. The charged particle beam device according to claim 15, wherein the first optical component is at least one of:
- a beam bender for bending the secondary charged particle beam; and
- a secondary particle optics, and wherein the second optical component is at least one of:
- a beam bender for bending the secondary charged particle beam; and
- a secondary particle optics.

17. The charged particle beam device according to claim 13, wherein the secondary charged particle detectors of the detector dome comprise a third detector arranged downstream, with respect to a third optical path of the secondary charged particle beam, of the beam separation unit,
wherein either an azimuthal angle exists between the second plane and a third plane, the third plane containing the optical axis defined by the beam separation unit and extending through the third detector,
or wherein the third plane coincides with the second plane and a third polar angle between the optical axis defined by the beam separation unit and a third reference axis contained in the third plane and extending through the beam separation unit and through the third detector, is different from the second polar angle.

18. The charged particle beam device according to claim 12, wherein the azimuthal angle between the first plane and the second plane lies in the range from 10 to 100 degrees, more particularly from 25 to 60 degrees.

19. The charged particle beam device according to claim 12, further comprising a dispersion compensation unit of two-dimensional Wien filter type adapted to act on the primary charged particle beam and arranged upstream of the beam separation unit in relation to the primary charged particle beam, wherein the dispersion compensation unit has an adjustable dispersion for compensating a dispersion of the beam separation unit.

20. A charged particle beam device comprising:
- a beam emitter for emitting a primary charged particle beam;
- a beam separation unit for separating the primary charged particle beam from a secondary charged particle beam generated by impingement of the primary charged particle beam onto a sample, the beam separation unit being adapted for generating a first magnetic field, a second magnetic field, a first electric field and a second electric field;
- a first optical component distanced from the beam separation unit; and
- a second optical component distanced from the beam separation unit and away from the first optical component,
wherein the beam separation unit is configured
- for aligning a travel direction of the primary charged particle beam leaving the beam separation unit with a first target axis under the influence of the first electric field and the first magnetic field and for deflecting the secondary charged particle beam in the beam separation unit under the influence of the first electric field and the first magnetic field to travel from the beam separation unit to the first optical component, and
- for aligning the travel direction of the primary charged particle beam leaving the beam separation unit with the first target axis under the influence of the second electric field and the second magnetic field, and for deflecting the secondary charged particle beam in the beam separation unit under the influence of the second electric field and the second magnetic field to travel from the beam separation unit to the second optical component.

* * * * *